(12) United States Patent
Facchetti

(10) Patent No.: US 8,901,547 B2
(45) Date of Patent: Dec. 2, 2014

(54) STACKED STRUCTURE ORGANIC LIGHT-EMITTING TRANSISTORS

(71) Applicant: Polyera Corporation, Skokie, IL (US)

(72) Inventor: Antonio Facchetti, Chicago, IL (US)

(73) Assignee: Polyera Corporation, Skokie, IL (US)

( * ) Notice: Subject to any disclaimer, the term of this patent is extended or adjusted under 35 U.S.C. 154(b) by 0 days.

(21) Appl. No.: 13/830,283

(22) Filed: Mar. 14, 2013

(65) Prior Publication Data

US 2014/0054566 A1 Feb. 27, 2014

Related U.S. Application Data

(60) Provisional application No. 61/693,288, filed on Aug. 25, 2012, provisional application No. 61/701,760, filed on Sep. 17, 2012.

(51) Int. Cl.
| | | |
|---|---|---|
| *H01L 29/08* | (2006.01) | |
| *H01L 35/24* | (2006.01) | |
| *H01L 51/00* | (2006.01) | |
| *H01L 51/52* | (2006.01) | |

(52) U.S. Cl.
CPC ........ *H01L 21/5203* (2013.01); *H01L 51/5296* (2013.01)
USPC .................................. 257/40; 257/E51.018

(58) Field of Classification Search
CPC .................. H01L 27/3209; H01L 51/5296
USPC ........................................... 257/40, E51.018
See application file for complete search history.

(56) References Cited

U.S. PATENT DOCUMENTS

| | | | | |
|---|---|---|---|---|
| 7,868,319 | B2* | 1/2011 | Adachi et al. ............... | 257/40 |
| 8,008,656 | B2* | 8/2011 | Nakamura et al. ........... | 257/40 |
| 8,154,014 | B2* | 4/2012 | Tanaka et al. ............... | 257/40 |
| 2006/0261329 | A1* | 11/2006 | Muccini et al. ............. | 257/40 |
| 2008/0142789 | A1 | 6/2008 | Suganuma ................... | 257/40 |

(Continued)

FOREIGN PATENT DOCUMENTS

| | | |
|---|---|---|
| JP | 2002164166 | 6/2002 |
| JP | 2011100938 | 5/2011 |
| WO | 2004/086526 | 10/2004 |
| WO | 2007/010925 | 1/2007 |

OTHER PUBLICATIONS

Rost et al: "Light-emitting ambipolar organic heterostructure field-effect transistor", *Synthetic Metals*, 146(3): 237-241 (2004).

(Continued)

*Primary Examiner* — Ida M Soward
(74) *Attorney, Agent, or Firm* — Karen K. Chan

(57) ABSTRACT

The present stacked structure organic light-emitting transistors include new arrangements of electrodes that can favor carrier recombination and exciton formation. More specifically, the stacked structure includes a substrate, a gate electrode, a channel layer having one or more organic sublayers, a dielectric layer positioned between the gate electrode and the channel layer, and a hole electrode and an electron electrode that are spaced apart from each other at a planar distance defining the length of a channel region in between. Each of the hole electrode and the electron electrode is positioned either within the channel layer or on top of a first side of the channel layer. Additionally, the hole electrode and the electron electrode are positioned away from a second side of the channel layer at different distances.

16 Claims, 15 Drawing Sheets

(56) References Cited

U.S. PATENT DOCUMENTS

| | | | |
|---|---|---|---|
| 2010/0090202 A1* | 4/2010 | Obata et al. | 257/40 |
| 2010/0243993 A1* | 9/2010 | Saito et al. | 257/40 |
| 2012/0248633 A1* | 10/2012 | Fukuda et al. | 257/787 |
| 2012/0273768 A1* | 11/2012 | Ikeda et al. | 257/40 |
| 2013/0009209 A1* | 1/2013 | Yamazaki | 257/192 |
| 2013/0069020 A1* | 3/2013 | May et al. | 252/519.21 |
| 2013/0200336 A1* | 8/2013 | Vaidyanathan et al. | 257/40 |
| 2013/0200345 A1* | 8/2013 | Usta et al. | 257/40 |
| 2013/0289279 A1* | 10/2013 | Gessner et al. | 546/37 |
| 2014/0061616 A1* | 3/2014 | Sunagawa et al. | 257/40 |

OTHER PUBLICATIONS

Rost et al: "Ambipolar light-emitting organic field-effect transistor", *Appl. Phys. Lett.*, 85(9): 1613-1615 (2004).

* cited by examiner a.

STACKED STRUCTURE ORGANIC LIGHT-EMITTING TRANSISTORS

CROSS-REFERENCE TO RELATED APPLICATIONS

This application claims priority to and the benefit of U.S. Provisional Patent Application Ser. No. 61/693,288, filed on Aug. 25, 2012, and U.S. Provisional Patent Application Ser. No. 61/701,760, filed on Sep. 17, 2012, the disclosure of each of which is incorporated by reference herein in its entirety.

BACKGROUND

The potential of organic semiconductor-based devices for light generation is demonstrated by the commercialization of display technologies based on organic light-emitting diodes (OLEDs). Nonetheless, device complexity, efficient integration between frontplane and backplane components as well as exciton quenching and photon loss processes still limit OLED efficiency and brightness.

Organic light-emitting transistor (OLET) is a recently developed optoelectronic device that combines the switching mechanism of a thin-film transistor and an electroluminescent device. While charge transport occurs perpendicular to the organic layers in an OLED, the majority of the current flows horizontally through the semiconducting layers in an OLET. As a result, light in an OLET is emitted as a stripe along the emissive layer, rather than uniformly through the electrode areas as in conventional OLEDs. The planar transport geometry of OLETs helps suppress deleterious photon losses and exciton quenching mechanisms inherent in the OLED architecture. Accordingly, the same organic electroluminescent light-emitting material has been shown to achieve much higher external quantum efficiency (EQE) in an OLET than in an equivalent OLED.

In particular, a trilayer heterostructure OLET has been reported with a maximum EQE of about 5%. The reported trilayer heterostructure OLET includes, from bottom to top, a transparent substrate, a gate electrode, a gate dielectric, an active layer consisting of the superposition of three organic layers, and source and drain electrodes on top of the active layer. The trilayer active layer includes a light-emitting host-guest matrix sandwiched between an electron-transporting (n-type) semiconductor and a hole-transporting (p-type) semiconductor. However, because only a small portion of the current is converted into excitons, one area of weakness for this device structure is the limited brightness.

Accordingly, there is a need in the art to develop new OLET device structures that can provide improved brightness.

SUMMARY

In light of the foregoing, the present teachings provide light-emitting transistors having novel structures that can lead to enhanced device brightness, specifically, via new arrangements of electrodes that can favor charge injection from the electrodes, carrier recombination, and exciton formation.

In one aspect, the present teachings provide a light-emitting transistor that includes a substrate, a gate electrode, a channel layer including one or more organic sublayers, a dielectric layer positioned between the gate electrode and the channel layer, and a hole electrode and an electron electrode that independently are coupled to the channel layer but are positioned relative to each other in a staggered or nonplanar configuration. In particular, the channel layer can have a first side and a second side, and each of the hole electrode and the electron electrode can be positioned either within the channel layer or on top of the first side of the channel layer. However, unlike conventional OLETs in which the hole electrode and the electron electrode lie in the same plane (for example, both electrodes can be position on top of the first side of the channel layer or both electrodes can be positioned within the channel layer), in the present OLET, the hole electrode is positioned away from the second side of the channel layer at a distance d1 and the electron electrode is positioned away from the second side of the channel layer at a distance d2 that is different from d1.

In the direction parallel to the plane of the substrate, the hole electrode and the electron electrode are spaced apart from each other to define the channel region as in a conventional OLET. The channel region has a length (L) that is defined as the distance between the hole electrode and the electron electrode if they were positioned on the same plane (referred herein as the planar distance). The channel layer can include one or more organic sublayers, typically including an electron transport sublayer comprising an electron-transporting (n-type) semiconductor material, a hole transport sublayer comprising a hole-transporting (p-type) semiconductor material, and an emissive sublayer comprising an organic electroluminescent semiconductor material that is sandwiched between the electron transport sublayer and the hole transport sublayer. The n-type semiconductor material and the p-type semiconductor material can be selected from organic semiconductor materials (e.g., small molecule semiconductors, polymeric semiconductors, or combinations thereof) and inorganic semiconductor materials (e.g., metal oxides or chalcogenides).

For example, in some embodiments, one of the hole electrode and the electron electrode can be positioned on top of the channel layer, while the other of the hole electrode and the electron electrode can be positioned within the channel layer. In other embodiments, the hole electrode and the electron electrode can be positioned in a different sublayer within channel layer.

In certain embodiments, one of the hole electrode and the electron electrode can be positioned within the first sublayer (e.g., the hole transport sublayer), while the other of the hole electrode and the electron electrode can be positioned within the third sublayer (the emissive sublayer) and in contact with the first sublayer. In certain embodiments, one of the hole electrode and the electron electrode can be positioned within the first sublayer, while the other of the hole electrode and the electron electrode can be positioned within the third sublayer but not in contact with the first sublayer. In certain embodiments, one of the hole electrode and the electron electrode can be positioned within the first sublayer, and the other of the hole electrode and the electron electrode can be positioned on top of the channel layer and in contact with the second sublayer (e.g., the electron transport sublayer).

In certain embodiments, one of the hole electrode and the electron electrode can be positioned within the third sublayer and in contact with the first sublayer, and the other of the hole electrode and the electron electrode can be positioned within the third sublayer but not in contact with the first sublayer. In certain embodiments, one of the hole electrode and the electron electrode can be positioned within the third sublayer and in contact with the first sublayer, while the other of the hole electrode and the electron electrode can be positioned within the second sublayer. In certain embodiments, one of the hole electrode and the electron electrode can be positioned within the third sublayer and in contact with the first sublayer, while the other of the hole electrode and the electron electrode can be positioned on top of the channel layer and in contact with the second sublayer.

In certain embodiments, one of the hole electrode and the electron electrode can be positioned within the second sublayer and in contact with the third sublayer, while the other of the hole electrode and the electron electrode can be positioned within the third sublayer. In certain embodiments, one of the hole electrode and the electron electrode can be positioned within the second sublayer and in contact with the third sublayer, while the other of the hole electrode and the electron electrode can be positioned on top of the channel layer and in contact with the second sublayer.

In certain embodiments, one of the hole electrode and the electron electrode can be positioned on top of the first channel layer and in contact with the second sublayer, while the other of the hole electrode and the electron electrode can be positioned within the third sublayer.

In various embodiments, the present OLET can further include an electron-injection layer deposited between the electron transport sublayer and the electron electrode. In various embodiments, the present OLET can further include a hole-injection layer deposited between the hole transport sublayer and the hole electrode. The present OLET can have a bottom-gate structure, wherein the gate electrode is coupled to the substrate. Alternatively, the present OLET can have a top-gate structure, wherein the channel layer is coupled to the substrate.

In some embodiments, the gate electrode can have a length ($L_G$) that is identical to L, and wherein the edges of the gate electrode are aligned with an edge of the hole electrode and an edge of the electron electrode. In other embodiments, the gate electrode can have a length ($L_G$) that is greater than L, and wherein at least one edge of the gate electrode overlaps with one of the hole electrode and the electron electrode.

In various embodiments, the hole electrode can be positioned in contact with the hole transport sublayer, and the electron electrode can be positioned in contact with the electron transport sublayer, to minimize contact resistance.

In another aspect, the present teachings provide a light-emitting transistor that includes a substrate, a gate electrode, a channel layer including one or more organic sublayers, a dielectric layer positioned between the gate electrode and the channel layer, and a hole electrode and an electron electrode that are coupled to the channel layer and are spaced apart from each other to define a channel region having a length (L), wherein the gate electrode is not aligned with the channel region. More specifically, the gate electrode is offset from an edge of either the hole electrode or the electron electrode towards the other of the hole electrode and the electron electrode such that the gate electrode overlaps partially or entirely with the other of the hole electrode and the electron electrode (i.e., occupying the same space or an overlapping space but on a different plane within the vertical stack). For example, the gate electrode can include a length ($L_G$) that is identical to or greater than L, and the gate electrode is positioned in a way such that an edge of the gate electrode is spaced apart from an edge of the hole electrode at a planar distance (d) that is greater than 0 but less than or equal to L, thereby resulting in an overlap with electron electrode.

In some embodiments, the present OLET with the offset gate electrode can include coplanar hole and electron electrodes. In other embodiments, the present OLET with the offset gate electrode can include nonplanar hole and electron electrodes. For example, in certain embodiments, the present OLET can have a gate electrode that overlaps with the electron electrode, and wherein the electron electrode is positioned on top of the electron transport sublayer while the hole electrode can be either coplanar with the electron electrode, or deposited on the emissive sublayer and in contact with the electron transport sublayer, or deposited within the emissive sublayer, or deposited on the hole transport sublayer and in contact with the emissive sublayer, or deposited on the dielectric layer in contact with the hole transport layer.

In certain embodiments, the present OLET can have a gate electrode that overlaps with the electron electrode, and wherein the electron electrode is positioned within the electron transport sublayer, while the hole electrode can be either positioned on top of the channel layer, or coplanar with the electron electrode, or deposited within the emissive sublayer, or deposited on the hole transport sublayer and in contact with the emissive sublayer, or deposited on the dielectric layer in contact with the hole transport layer.

In certain embodiments, the present OLET can have a gate electrode that overlaps with the electron electrode, and wherein the electron electrode is positioned within the emissive sublayer, while the hole electrode can be either positioned on top of the channel layer, or positioned within the electron transport sublayer, or coplanar with the electron electrode, or deposited on the hole transport sublayer and in contact with the emissive sublayer, or deposited on the dielectric layer in contact with the hole transport layer.

In certain embodiments, the present OLET can have a gate electrode that overlaps with the electron electrode, and wherein the electron electrode is deposited on the electron transport sublayer in contact with the emissive sublayer, while the hole electrode can be either positioned on top of the channel layer in contact with the hole transport sublayer, or positioned within the hole transport sublayer, or deposited within the emissive layer, or coplanar with the electron electrode, or deposited on the dielectric layer in contact with the electron transport layer. In these embodiments, the hole transport sublayer can be the top sublayer, and the electron transport sublayer can be in contact with the dielectric layer.

In certain embodiments, the present OLET can have a gate electrode that overlaps with the electron electrode, and wherein the electron electrode is deposited on the dielectric layer in contact with the electron transport sublayer, while the hole electrode can be either positioned on top of the channel layer in contact with the hole transport sublayer, or positioned within the hole transport sublayer, or deposited within the emissive layer, or deposited on the electron transport sublayer in contact with the emissive sublayer, or coplanar with the electron electrode. In these embodiments, the hole transport sublayer can be the top sublayer, and the electron transport sublayer can be in contact with the dielectric layer.

In a further aspect, the present OLET can have a hole electrode and an electron electrode that are positioned in a nonplanar arrangement, and a gate electrode that is offset from the channel region to overlap with either the hole electrode and the electron electrode. In some embodiments, the hole electrode can be positioned in contact with the hole transport sublayer, and the electron electrode can be positioned in contact with the electron transport sublayer, to minimize contact resistance. In certain embodiments, to compensate for a lower mobility attributed to the semiconductor layer furthest away from the dielectric layer, the gate electrode in a bottom-gate configuration can be offset to overlap with the hole electrode or the electron electrode that is positioned further away from the dielectric layer. In particular embodiments, a hole injection layer can be positioned between the hole electrode and the hole transport sublayer, and an electron injection layer can be positioned between the electron electrode and the hole transport sublayer.

The present teachings also relate to methods of fabricating the OLETs described herein. For example, any of the electrodes and/or any of the sublayers of the channel layer of the present OLETs can be fabricated by a process selected from the group consisting of thermal evaporation, sputtering, atomic layer deposition, chemical vapor deposition, solution processing, spin-coating, slot die coating, and printing.

The foregoing as well as other features and advantages of the present teachings will be more fully understood from the following figures, description, examples, and claims.

BRIEF DESCRIPTION OF THE DRAWINGS

It should be understood that the drawings described below are for illustration purpose only. The drawings are not necessarily to scale, with emphasis generally being placed upon illustrating the principles of the present teachings. The drawings are not intended to limit the scope of the present teachings in any way.

FIG. 10 illustrates different embodiments of OLETs according to the present teachings having a gate electrode 4 that overlaps with the electron electrode 14, and wherein the electron electrode 14 is positioned on top of the electron transport sublayer 8c while the hole electrode 12 is (a) coplanar with the electron electrode 14, (b) deposited on the emissive sublayer 8b and in contact with the electron transport sublayer 8c, (c) deposited within the emissive sublayer 8b, (d) deposited on the hole transport sublayer 8a and in contact with the emissive sublayer 8b, and (e) deposited on the dielectric layer 6 in contact with the hole transport layer 8a.

FIG. 11 illustrates different embodiments of OLETs according to the present teachings having a gate electrode 4 that overlaps with the electron electrode 14, and wherein the electron electrode 14 is positioned within the electron transport sublayer 8c, while the hole electrode 12 is (a) positioned on top of the channel layer 8, (b) coplanar with the electron electrode 14, (c) deposited within the emissive sublayer 8b, (d) deposited on the hole transport sublayer 8a and in contact with the emissive sublayer 8b, and (e) deposited on the dielectric layer 6 in contact with the hole transport layer 8a.

FIG. 12 illustrates different embodiments of OLETs according to the present teachings having a gate electrode 4 that overlaps with the electron electrode 14, and wherein the electron electrode 14 is positioned within the emissive sublayer 8b, while the hole electrode 12 is (a) positioned on top of the channel layer 8, (b) positioned within the electron transport sublayer 8c, (c) coplanar with the electron electrode 14, (d) deposited on the hole transport sublayer 8a and in contact with the emissive sublayer 8b, and (e) deposited on the dielectric layer 6 in contact with the hole transport layer 8a.

DETAILED DESCRIPTION

Figure 1:
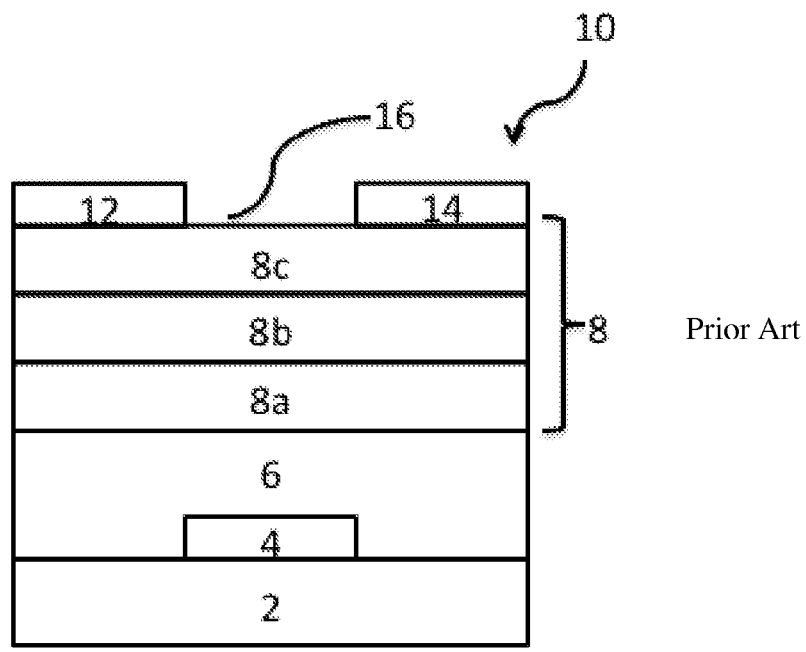
FIG. 1 shows a cross section view of (a) a prior art top-gate light-emitting transistor 10, wherein coplanar source and drain contacts (hole and electron electrodes 12, 14) are positioned on top of the active layer 8 and (b) a prior art bottom-gate light emitting transistor 20, wherein coplanar source and drain contacts (hole and electron electrodes 12, 14) are positioned within the active layer 8.
Figure 1:
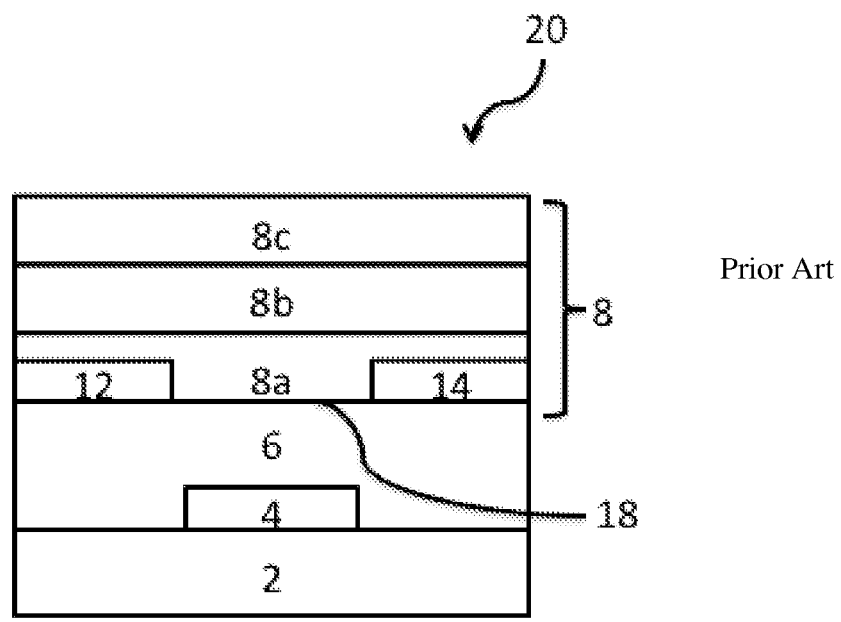

Throughout the application, where compositions are described as having, including, or comprising specific components, or where processes are described as having, including, or comprising specific process steps, it is contemplated that compositions of the present teachings also consist essentially of, or consist of, the recited components, and that the processes of the present teachings also consist essentially of, or consist of, the recited process steps.

In the application, where an element or component is said to be included in and/or selected from a list of recited elements or components, it should be understood that the element or component can be any one of the recited elements or components, or can be selected from a group consisting of two or more of the recited elements or components. Further, it should be understood that elements and/or features of a composition, an apparatus, or a method described herein can be combined in a variety of ways without departing from the spirit and scope of the present teachings, whether explicit or implicit herein.

The use of the terms "include," "includes", "including," "have," "has," or "having" should be generally understood as open-ended and non-limiting unless specifically stated otherwise.

The use of the singular herein includes the plural (and vice versa) unless specifically stated otherwise. In addition, where the use of the term "about" is before a quantitative value, the present teachings also include the specific quantitative value itself, unless specifically stated otherwise. As used herein, the term "about" refers to a ±10% variation from the nominal value unless otherwise indicated or inferred.

It should be understood that the order of steps or order for performing certain actions is immaterial so long as the present teachings remain operable. Moreover, two or more steps or actions may be conducted simultaneously.

As used herein, a "p-type semiconductor material," "p-type semiconductor" or a "p-type OSC" refers to a semiconductor material or a semiconducting compound having holes as the majority current or charge carriers. In some embodiments, when a p-type semiconductor material is deposited on a substrate, it can provide a hole mobility in excess of about $10^{-5}$ cm$^2$/Vs. In the case of field-effect devices, a p-type semiconductor can also exhibit a current on/off ratio of greater than about 10. In certain embodiments, a p-type OSC can be characterized by a highest occupied molecular orbital (HOMO) energy that is higher than or about −6.4 V, preferably higher than or about −6.2 V, and more preferably, higher than or about −6.0 V.

As used herein, an "n-type semiconductor material," an "n-type semiconductor" or an "n-type OSC" refers to a semiconductor material or a semiconducting compound having electrons as the majority current or charge carriers. In some embodiments, when an n-type semiconductor material is deposited on a substrate, it can provide an electron mobility in excess of about $10^{-5}$ cm$^2$/Vs. In the case of field-effect devices, an n-type semiconductor can also exhibit a current on/off ratio of greater than about 10. In certain embodiments, an n-type OSC can be characterized by a lowest unoccupied molecular orbital (LUMO) energy that is lower than or about −3.2 V, preferably lower than or about −3.6 V, and more preferably, lower than or about −4.0 V.

As used herein, "mobility" refers to a measure of the velocity with which charge carriers, for example, holes (or units of positive charge) in the case of a p-type semiconductor material and electrons in the case of an n-type semiconductor material, move through the material under the influence of an electric field. This parameter, which limited depends on the device architecture, can be measured using a field-effect device or space-charge current measurements.

As used herein, "solution-processable" refers to compounds, materials, or compositions that can be used in various solution-phase processes including spin-coating, printing (e.g., inkjet printing, screen printing, pad printing, offset printing, gravure printing, flexographic printing, lithographic printing, mass-printing and the like), spray coating, electrospray coating, drop casting, dip coating, and blade coating.

Referring to the drawings wherein like reference numerals represent like elements throughout the various drawing figures, a conventional organic light-emitting transistor (OLET) typically has a vertically stacked structure that includes a substrate 2, a gate electrode 4, a dielectric layer 6 in contact with the gate electrode, an active channel layer 8, and a hole electrode 12 and an electron electrode 14 that are in contact with the active channel layer. The active channel layer can include one or more organic semiconductor materials that individually or in combination can perform the function of electron transport, hole transport, and light emission. For example, in the trilayer heterostructure OLET shown in FIG. 1, the active channel layer 8 can include sublayers 8a and 8c which, respectively, are adapted to allow transport of charge carriers of opposite types, and sublayer 8b which is adapted to facilitate recombination of holes and electrons to generate light.

With continued reference to FIG. 1, conventional OLETs have coplanar hole electrode 12 and electron electrode 14 through which positive charge carriers (holes) and negative charge carriers (electrons), respectively, are injected into the active channel layer 8. The hole electrode 12 and the electron electrode 14 can be deposited on top of the active channel layer 8 as illustrated in the top-contact device 10 shown in FIG. 1a, or the active channel layer 8 can be deposited over the hole electrode 12 and the electron electrode 14 as illustrated in the bottom-contact device 20 shown in FIG. 1b. The in-plane hole and electron electrodes are spaced apart at a distance that defines the length of the channel region. The gate electrode 4 typically has a length approximating the channel length and is aligned with the channel region.

The present teachings relate to OLETs having novel architectures characterized by (1) non-planar hole electrode and electron electrode and/or (2) a gate electrode which is offset from the channel region. The present OLETs can exhibit enhanced device brightness compared to conventional OLETs as explained in more detail below.

Figure 2:
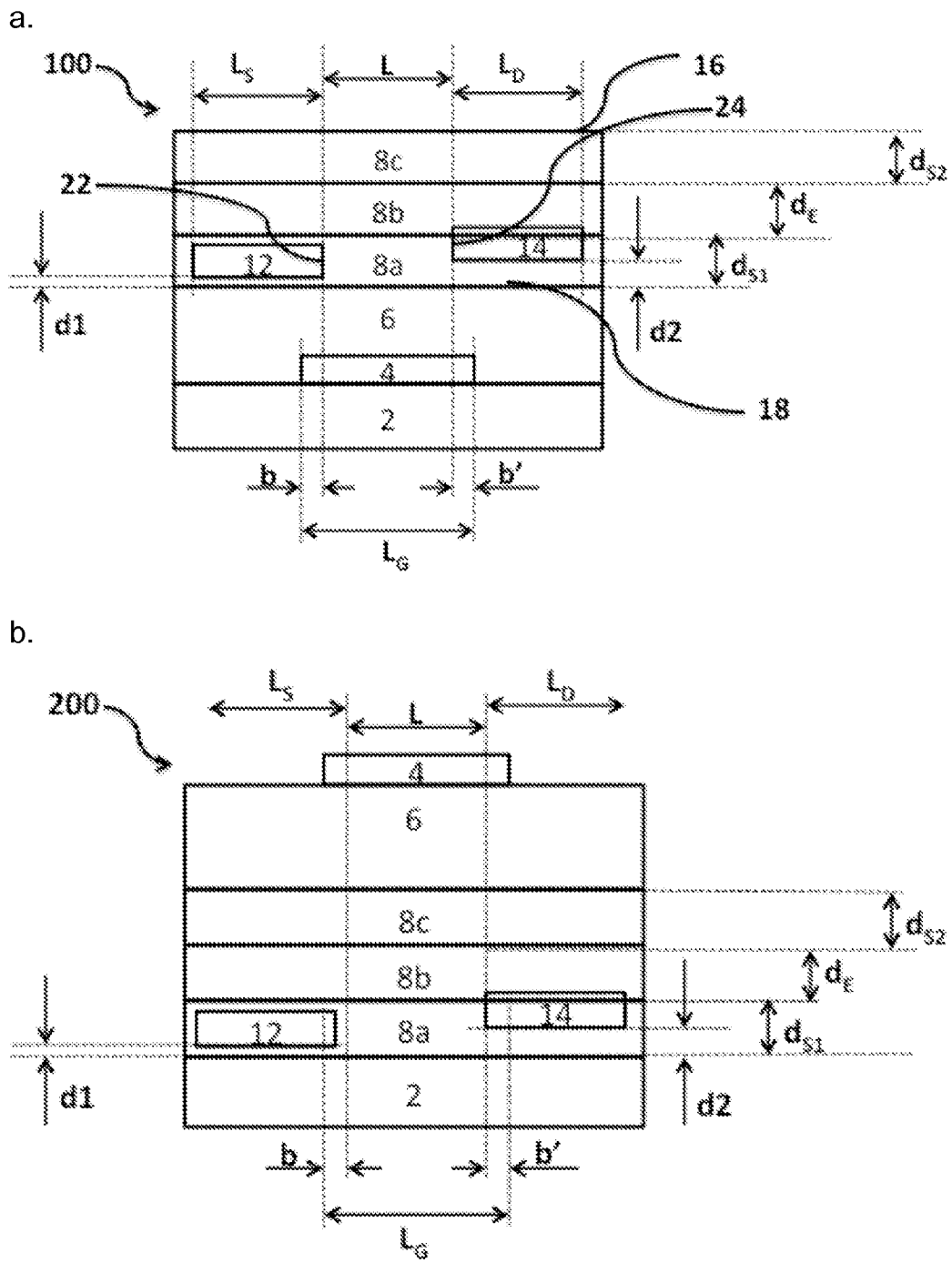
FIG. 2 shows a cross section view of (a) a bottom-gate light-emitting transistor 100 and (b) a top-gate light-emitting transistor 200 according to the present teachings, wherein the source and drain contacts (hole and electron electrodes 12, 14) are offset vertically from each other.
Figure 3:
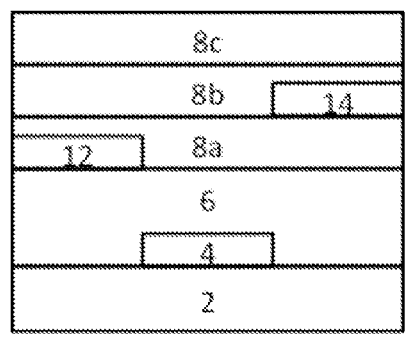
FIG. 3 illustrates different embodiments of OLETs according to the present teachings, wherein the hole electrode 12 is positioned within the hole transport sublayer 8a, and the electron electrode 14 is positioned (a and b) within the emissive sublayer 8b, (c) within the electron transport sublayer 8c, or (d) on top of the channel layer in contact with the electron transport sublayer 8c.
Figure 3:
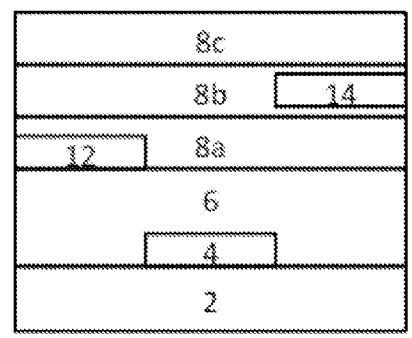
Figure 3:
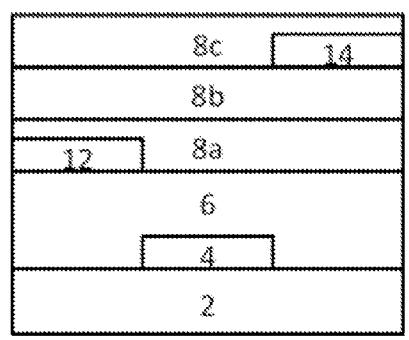
Figure 3:
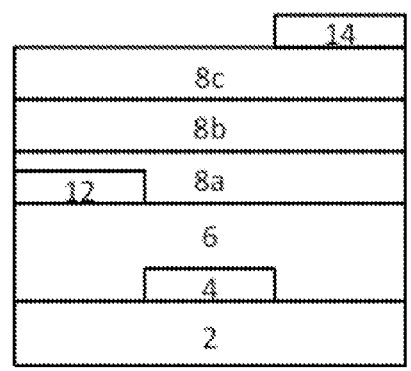
Figure 4:
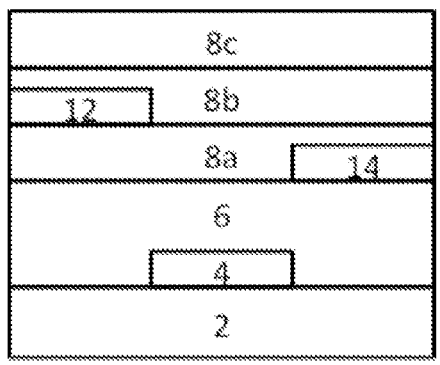
FIG. 4 illustrates different embodiments of OLETs according to the present teachings, wherein the hole electrode 12 is positioned within the emissive sublayer 8b in contact with the hole transport sublayer 8a, and the electron electrode 14 is positioned (a) within the hole transport sublayer 8a, (b) within the emissive sublayer 14 but not in contact with the hole transport sublayer 8a, (c) within the electron transport sublayer 8c, or (d) on top of the channel layer 8 in contact with the electron transport sublayer 8c.
Figure 4:
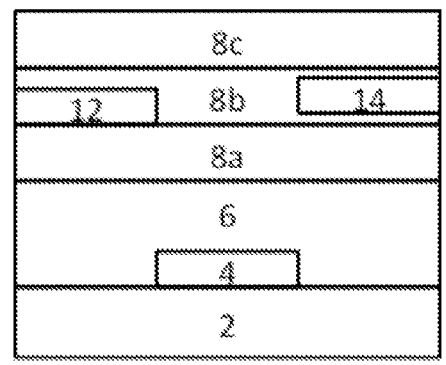
Figure 4:
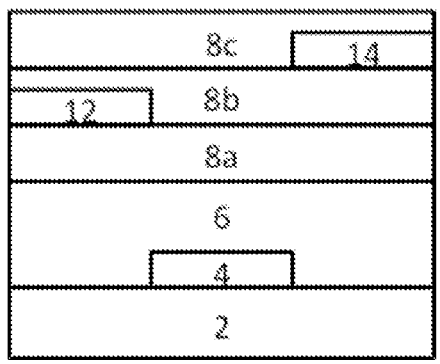
Figure 4:
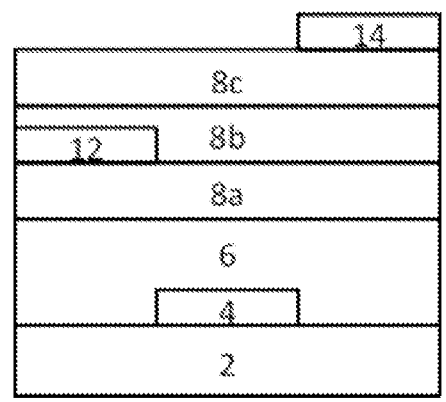
Figure 5:
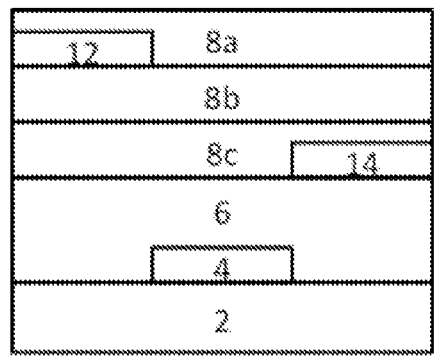
FIG. 5 illustrates different embodiments of OLETs according to the present teachings, wherein the hole electrode 12 is positioned within the hole transport sublayer 8a, and the electron electrode 14 is positioned (a) within the electron transport sublayer 8c, (b and c) within the emissive sublayer 8b, or (d) on top of the channel layer 8. In these embodiments, the hole transport sublayer 8a is the top sublayer, and the electron transport sublayer 8c is in contact with the dielectric layer 6.
Figure 5:
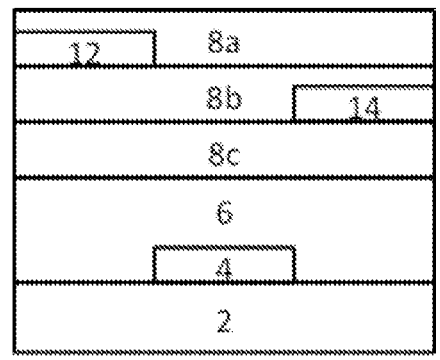
Figure 5:
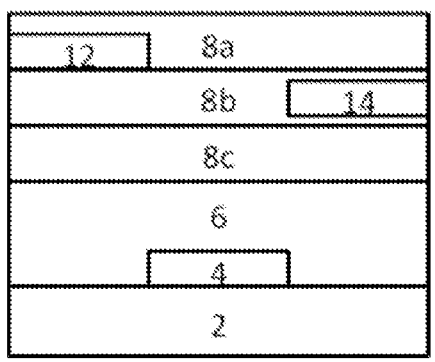
Figure 5:
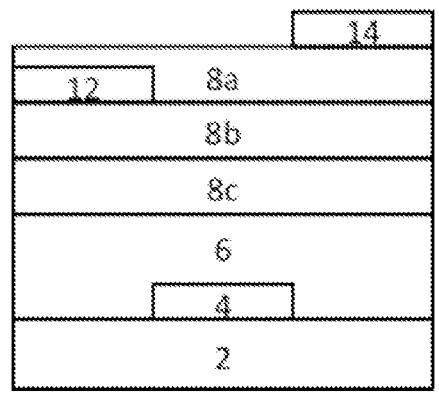
Figure 6:
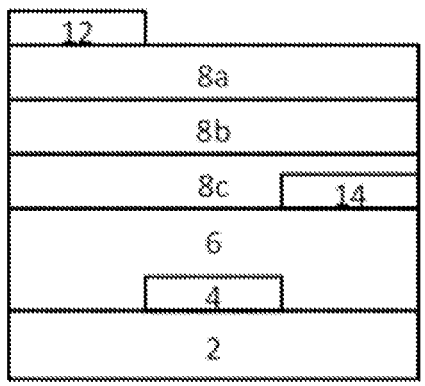
FIG. 6 illustrates different embodiments of OLETs according to the present teachings, wherein the hole electrode 12 is positioned on top of the channel layer 8 in contact with the hole transport layer 8a, and the electron electrode is positioned (a) within the electron transport sublayer 8c, (b and c) within the emissive sublayer 8b, or (d) within the hole transport sublayer 8a. In these embodiments, the hole transport sublayer 8a is the top sublayer, and the electron transport sublayer 8c is in contact with the dielectric layer 6.
Figure 6:
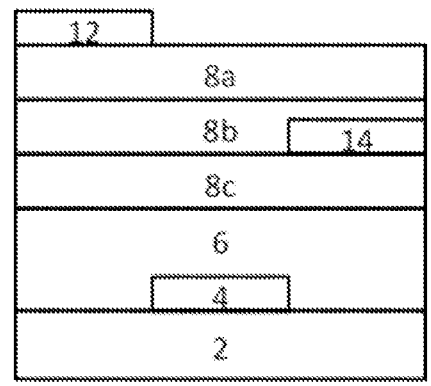
Figure 6:
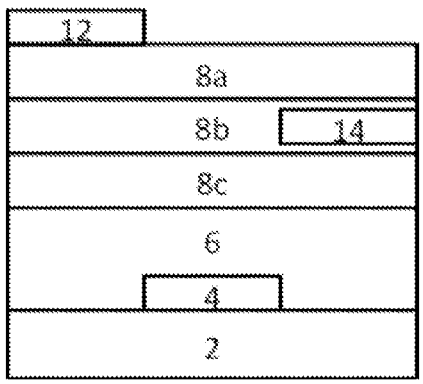
Figure 6:
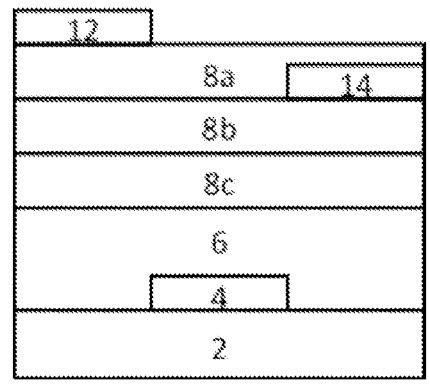

Referring to FIG. 2, an aspect of the present teachings relates to OLETs having nonplanar hole electrode and electron electrode. As understood by those skilled in the art, the hole electrode and the electron electrode can function, respectively, as the source electrode and the drain electrode (or vice versa) depending on the polarity of the gate voltage. Briefly, because the source electrode is typically grounded (0 V), if the gate voltage is −100V and the drain voltage is −80V, then the source electrode is the hole electrode (negatively biased) and the drain electrode is the electron electrode (positively biased). On the other hand, if the gate voltage is +100V, the source electrode is the electron electrode and the drain electrode is the hole electrode. Therefore, the present OLETs also can be described as having nonplanar source electrode and drain electrode.

As shown in FIG. 2, an OLET 100 according to the present teachings can have a hole electrode 12 and an electron electrode 14 that are offset vertically from each other. Referring back to FIG. 1, in conventional OLETs, both the hole electrode 12 and the electron electrode 14 typically are positioned either on top of a first side 16 of the channel layer 8 or in contact with a second side 18 of the channel layer 8. Referring to FIG. 2, if d1 refers to the distance from which the hole electrode is positioned away from the second side 18 of the channel layer and d2 refers to the distance from which the electron electrode is positioned away from the second side 18 of the channel layer, then it can be seen that in a conventional OLET, d1=d2, whereas in the present OLET, d1≠d2.

With continued reference to FIG. 2, sublayer 8a can comprise a first semiconductor material having a thickness $d_{S1}$, while sublayer 8c can comprise a second semiconductor material having a thickness $d_{S2}$, and sublayer 8b can comprise an emissive material having a thickness $d_E$. Thus, in certain embodiments of the present OLETs, the hole electrode 12 and the electron electrode 14 can be positioned within different sublayers of the channel layer 8. For example, d1 can be 0 (within sublayer 8a in contact with the second side 18 of the channel layer 8), while d2 can be $d_{S1}$ (within sublayer 8b in contact with sublayer 8a) or d2 can be $d_{S1}+d_E$ (within sublayer 8c in contact with sublayer 8b). In these embodiments, the hole electrode 12 can be deposited on the layer immediately adjacent to sublayer 8a (e.g., on the dielectric layer 6 in a bottom-gate architecture illustrated in FIG. 2a, or on the substrate 2 in a top-gate architecture illustrated in FIG. 2b), while the electron electrode 14 can be deposited on the sublayer 8a (d2=$d_{S1}$) or on the sublayer 8b (d2=$d_{S1}+d_E$). In other embodiments, one of the hole electrode 12 and the electron electrode 14 can be positioned on top of the first side 16 of the channel layer 8 (d1=$d_{S1}+d_E+d_{S2}$) while the other of the hole electrode 12 and the electron electrode 14 can be positioned within sublayer 8a (d2=0), 8b (d2=$d_{S1}$), or 8c (d2=$d_{S1}+d_E$).

In various embodiments, the gate electrode can have a length ($L_G$) equal to or greater than the channel length (L), which is the distance between the edge 22 of the hole electrode 12 adjacent to the channel region and the edge 24 of the electron electrode 24 adjacent to the channel region. In certain embodiments, the gate electrode can have a length $L_G$ that is the same as the length of the channel region L and can be located within a space that is aligned with the channel region. For example, in a bottom-gate configuration as shown in FIG. 2a, the gate electrode 4 can be deposited on the substrate 2, and the dielectric layer 6 can be formed over the gate electrode 4. Then, the hole electrode 12 and the electron electrode 14 can be patterned on the dielectric layer 6 in a way such that an edge 22 of the hole electrode 12 and an edge 24 of the electron electrode 14 are aligned with the edges of the gate electrode 4. Similarly, in the top-gate configuration shown in FIG. 2b, the hole electrode 12 and the electron electrode 14 first can be patterned on the substrate 2. Then, the active channel layer 8 can be formed (e.g. via sequential deposition of sublayers 8a, 8b, and 8c) over the hole electrode 12 and the electron electrode 14, followed by the deposition of the dielectric layer 6 over the channel layer 8. Subsequently, the gate electrode 4 can be patterned on the dielectric layer, such that the edges of the gate electrode 4 are aligned with an edge 22 of the hole electrode 12 and an edge 24 of the electron electrode 14.

In other embodiments, the gate electrode can have a length $L_G$ greater than L ($L_G$>L) such that the gate electrode overlaps with the hole electrode (e.g., $L_G$=L+b), the electron electrode (e.g., $L_G$=L+b'), or both the hole electrode and the electron electrode (e.g., $L_G$=L+b+b'). For example, L can be between about 2 μm and about 500 μm, preferably between about 5 μm and about 20 μm. The hole electrode and the electron electrode, respectively, can have a length $L_S$ and a length $L_D$ that independently are between about 50 μm and about 300 μm, preferably between about 100 μm and about 200 μm. The overlap b and b' of the gate electrode with either the hole electrode and/or the electron electrode can be 0 μm and up to the length ($L_S$ or $L_D$) of the hole electrode and/or the electron electrode (i.e., 0≤b≤$L_S$, 0≤b'≤$L_D$), but preferably, the overlap is between about 0 μm and about 100 μm. Accordingly, the length $L_G$ of the gate electrode can be between about 50 μm and about 500 μm, preferably between about 100 μm and about 200 μm. The thickness $d_{S1}$ and $d_{S2}$ of the two charge transport sublayers can be between about 5 μm and about 100 μm, whereas the thickness $d_E$ of the emissive sublayer can be between about 2 μm and about 50 μm.

FIGS. 3-6 illustrate various embodiments of OLETs having nonplanar hole and electron electrodes according to the present teachings.

Figure 7:
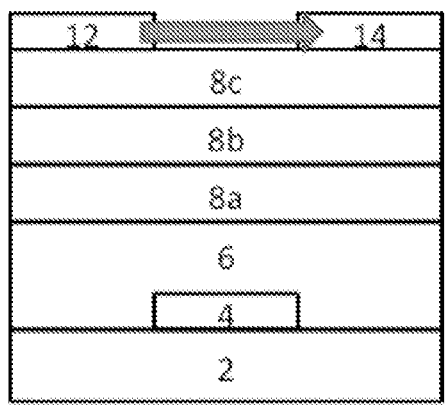
FIG. 7 compares the charge transport/light generating mechanisms of (a) a conventional trilayer OLET against (b) a trilayer OLET according to the present teachings.
Figure 7:
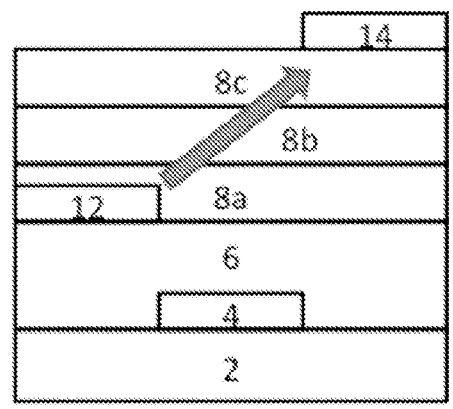
Figure 8:
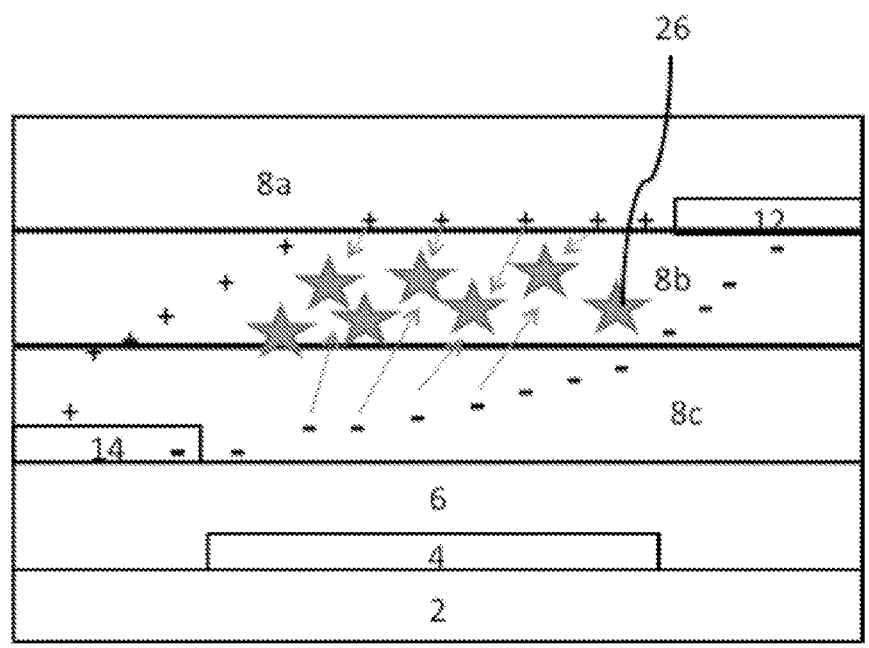
FIG. 8 illustrates how a nonplanar source-drain electric field can lead to increased exciton formation.

Without wishing to be bound to any particular theory, it is believed that having the hole electrode and the electron electrode (or the electrical source and drain contacts) in a nonplanar architecture will greatly favor exciton formation in a trilayer OLET, thus enhancing device brightness. Referring to FIG. 7a, in the conventional architecture, the source-drain electric field is parallel to the surface of the channel layer (indicated by the direction of the arrow). In this architecture, only the holes from the hole transport sublayer and the electrons from the electron transport sublayer that are electrostatically attracted into the emissive sublayer will recombine to form excitons. Therefore, the number of excitons that are actually formed often is a small fraction of the charge carriers moving through the charge transport sublayers. Referring to FIG. 7b and FIG. 8, in the architecture according to the present teachings, the source-drain electric field spans across the emissive sublayer 8b (as indicated by the direction of the arrow), that is, both hole and electron currents flow into the emissive sublayer. This results in a much greater probability for holes and electrons to meet in the emissive sublayer to form a larger number of excitons 26. Furthermore, referring back to FIG. 7a, because both the hole electrode and the electron electrode are deposited on the same surface and are in contact with a sublayer that favors the transport of only one type of charge carriers, large contact resistance inevitably results for one of the contacts. Referring to FIG. 8, the contact resistance can be reduced drastically by positioning the hole electrode 12 in contact with sublayer 8a composed of a p-type semiconductor which facilitates hole transport, and positioning the electron electrode 14 in contact with sublayer 8c composed of an n-type semiconductor which facilitates electron transport.

Another aspect of the present teachings relates to OLETs having a gate electrode offset from the channel region, such that the gate electrode overlaps in the same vertical space with either the hole electrode or the electron electrode, but not both of them. As mentioned above, in a conventional OLET, the gate electrode typically has a length $L_G$ that is the same as the length of the channel region L, and the gate electrode is located within a space that is aligned with the channel region. According to the present teachings, and referring to FIG. 9, instead of positioning the gate electrode to be aligned with the channel region, the gate electrode 4 is offset from the edge 22 of the hole electrode 12 or the edge 24 of the electron electrode 14, so that the gate electrode overlaps with either the hole electrode 12 or the electron electrode 14.

Figure 9:
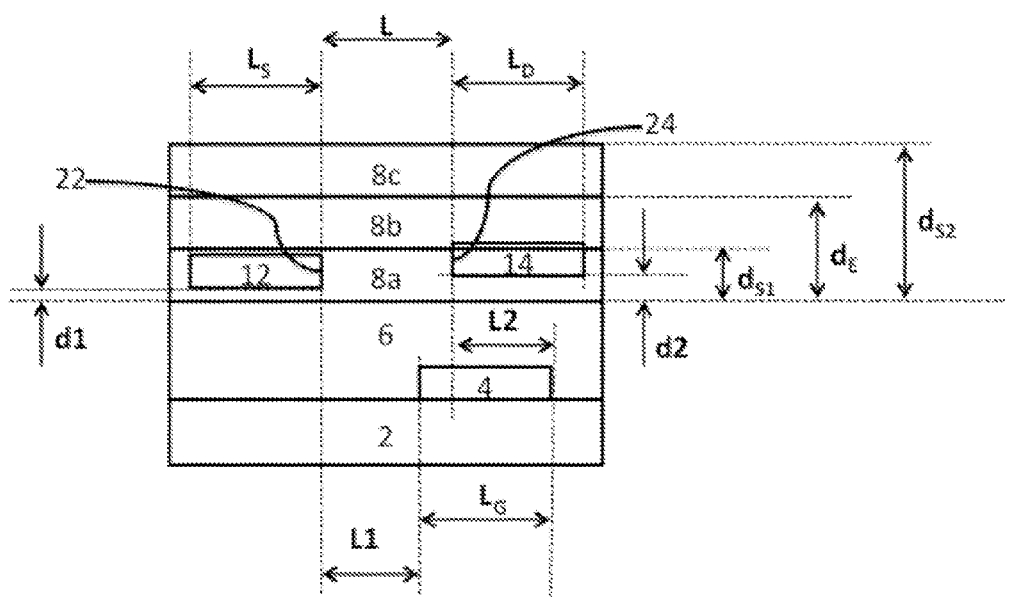
FIG. 9 shows a cross section view of a light-emitting transistor according to the present teachings, wherein the gate electrode overlaps with one of the source and drain contacts (or one of the hole and electron electrodes).
Figure 10:
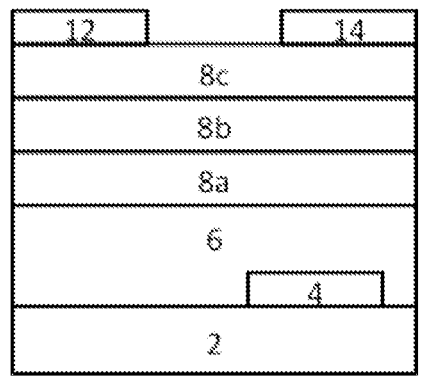
Figure 10:
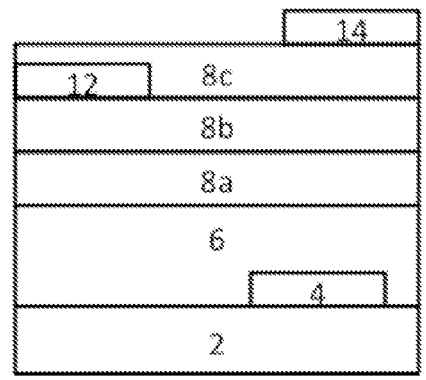
Figure 10:
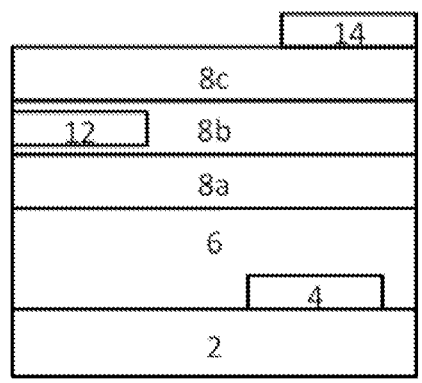
Figure 10:
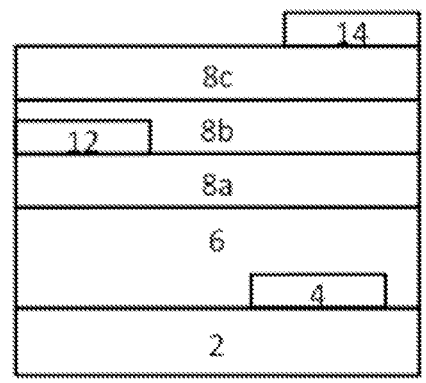
Figure 10:
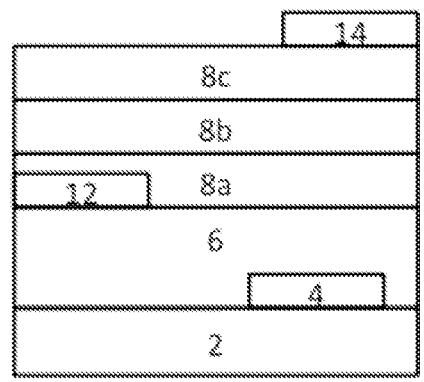
Figure 11:
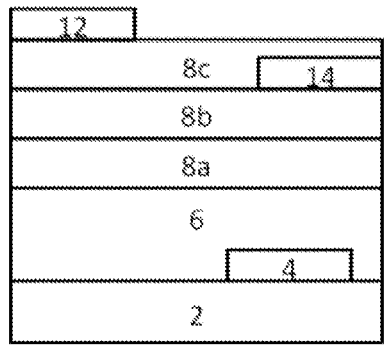
Figure 11:
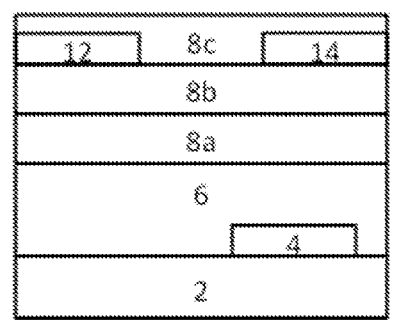
Figure 11:
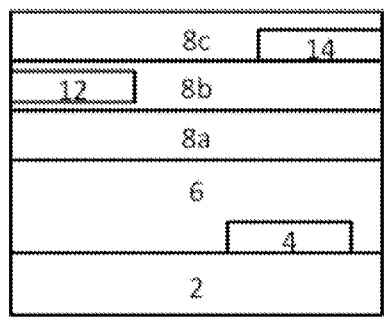
Figure 11:
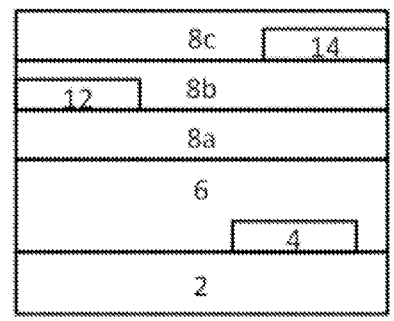
Figure 11:
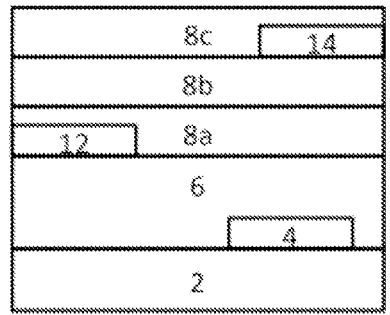
Figure 12:
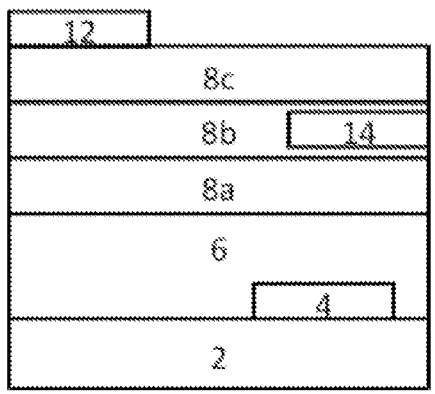
Figure 12:
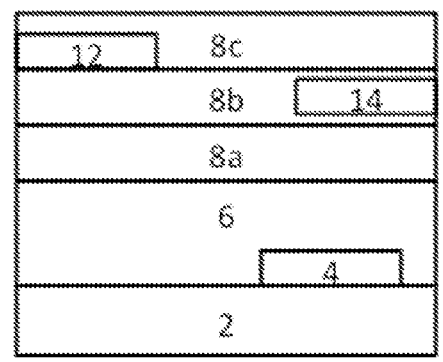
Figure 12:
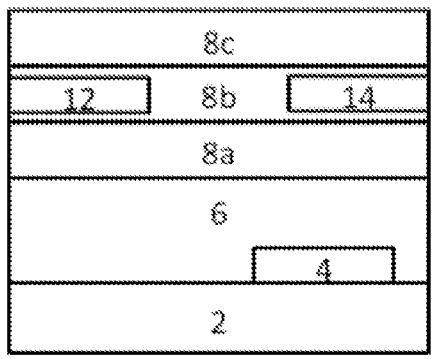
Figure 12:
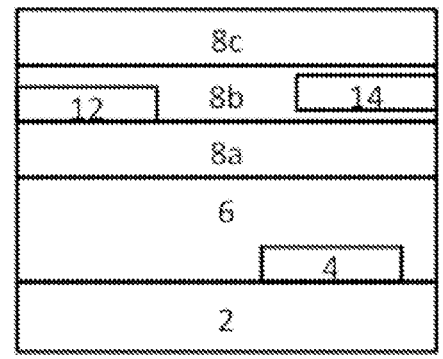
Figure 12:
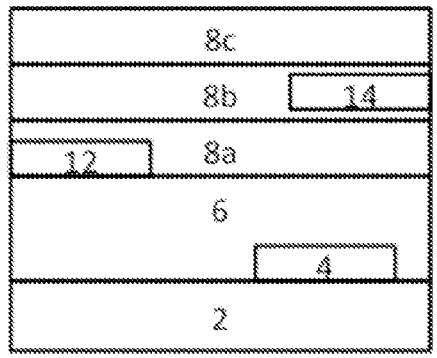
Figure 13:
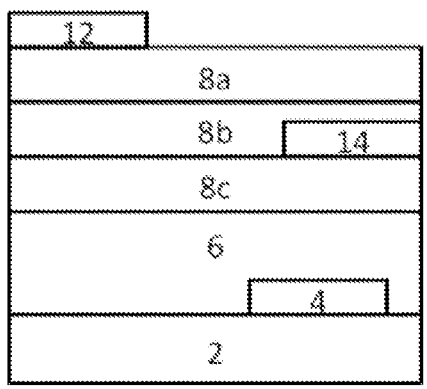
FIG. 13 illustrates different embodiments of OLETs according to the present teachings having a gate electrode 4 that overlaps with the electron electrode 14, and wherein the electron electrode 14 is deposited on the electron transport sublayer 8c in contact with the emissive sublayer 8b, while the hole electrode 12 is (a) positioned on top of the channel layer in contact with the hole transport sublayer 8a, (b) positioned within the hole transport sublayer 8a, (c) deposited within the emissive layer 8b, (d) coplanar with the electron electrode 14, and (e) deposited on the dielectric layer 6 in contact with the electron transport layer 8c. In these embodiments, the hole transport sublayer 8a is the top sublayer, and the electron transport sublayer 8c is in contact with the dielectric layer 6.
Figure 13:
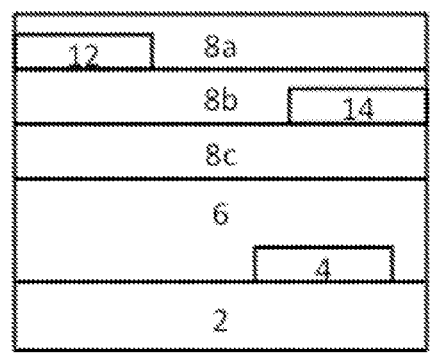
Figure 13:
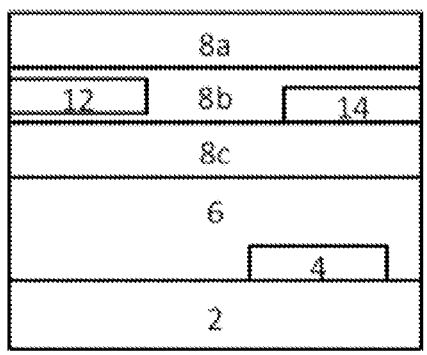
Figure 13:
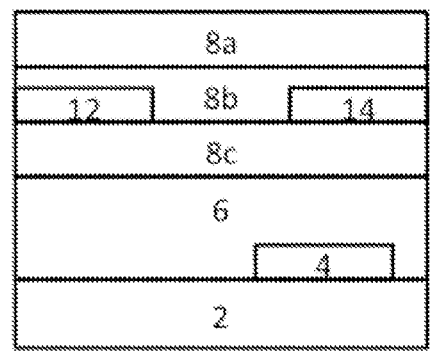
Figure 13:
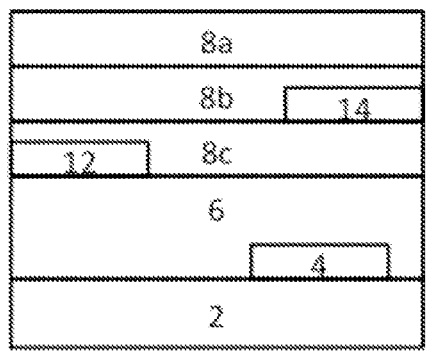
Figure 14:
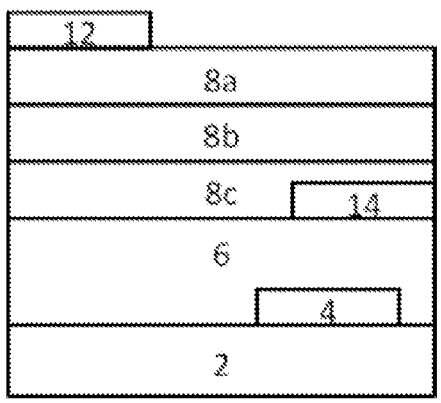
FIG. 14 illustrates different embodiments of OLETs according to the present teachings having a gate electrode 4 that overlaps with the electron electrode 14, and wherein the electron electrode 14 is deposited on the dielectric layer 6 in contact with the electron transport sublayer 8c, while the hole electrode 12 is (a) positioned on top of the channel layer in contact with the hole transport sublayer 8a, (b) positioned within the hole transport sublayer 8a, (c) deposited within the emissive layer 8b, (d) deposited on the electron transport sublayer 8c in contact with the emissive sublayer 8b, and (e) coplanar with the electron electrode 14. In these embodiments, the hole transport sublayer 8a is the top sublayer, and the electron transport sublayer 8c is in contact with the dielectric layer 6.
Figure 14:
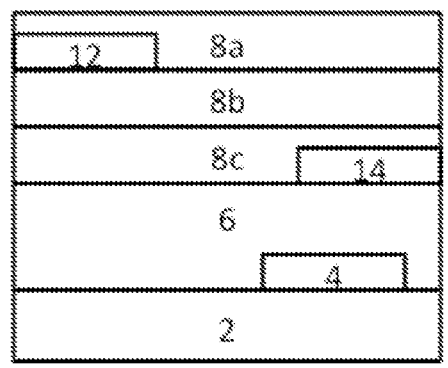
Figure 14:
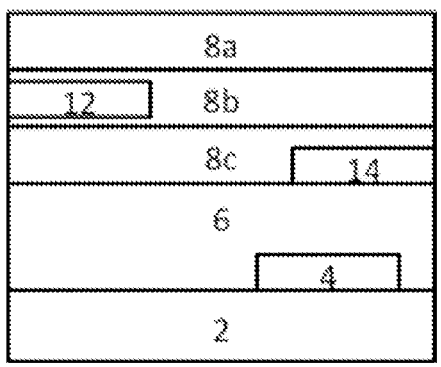
Figure 14:
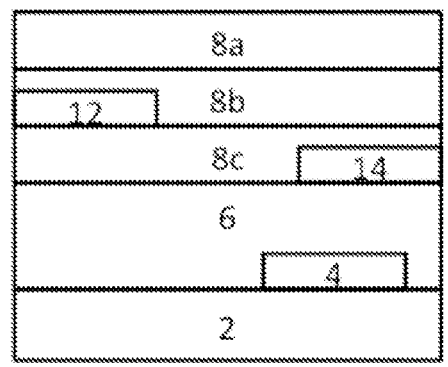
Figure 14:
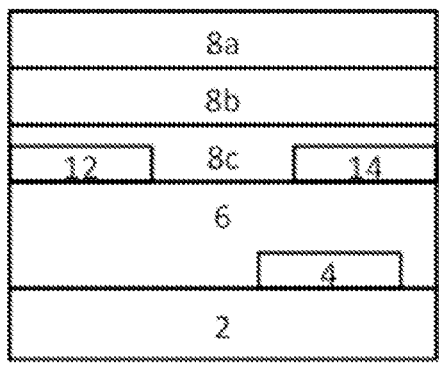

To illustrate, and referring to FIG. 9, the gate electrode 4 can be offset from the edge 22 of the hole electrode 12 by a distance L1, such that the gate electrode 4 overlaps with the electron electrode 14 by a distance L2 (as measured from the edge 24 of the electron electrode 14). The length of the gate electrode $L_G$ can approximate the length of the hole electrode ($L_S$) or the length of the electron electrode ($L_D$), which typically are between about 50 μm and about 300 μm, preferably between about 100 μm and about 200 μm. However, the gate electrode can have a length $L_G$ that is slightly longer or shorter than either $L_S$ or $L_D$, provided that $L_G < L + L_S$ or $L + L_D$. The offset distance L1 is greater than 0 and can be equal to L, i.e., $0 < L1 \leq L$. In some embodiments, L1 can be 0.5 L. In preferred embodiments, L1=L and L2=$L_D$. Similarly, the gate electrode 4 can be offset from the edge 24 of the electron electrode 14, such that it overlaps with the hole electrode 12. The placement of the hole electrode and the electron electrode can be planar as in conventional OLETs (i.e., d1=d2, for example, d1=d2=0 or d1=d2=$d_{S1}$+$d_E$+$d_{S2}$). In preferred embodiments, the hole electrode 12 and the electron electrode 14 are not in the same plane, i.e., d1≠d2, as described hereinabove.

FIGS. 10-14 illustrate various embodiments of OLETs having a gate electrode overlapping with the electron electrode according to the present teachings. In other embodiments, the gate electrode can be positioned to overlap with the hole electrode analogously.

Without wishing to be bound to any particular theory, it is believed that having the gate electrode overlap with only one of the charge injection electrodes can enable an unevenly distributed carrier density along the channel length. This can lead to a greater carrier density for both holes and electrons in the region of the channel layer where the gate electrode overlaps with the particular charge injection electrode.

Figure 15:
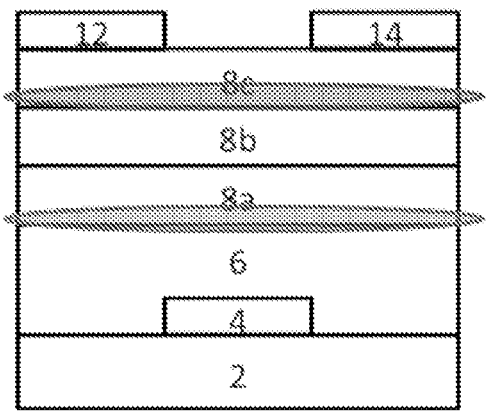
FIG. 15 compares the carrier density within the charge transport layers in (a) a conventional trilayer OLET against (b) a trilayer OLET according to the present teachings.
Figure 15:
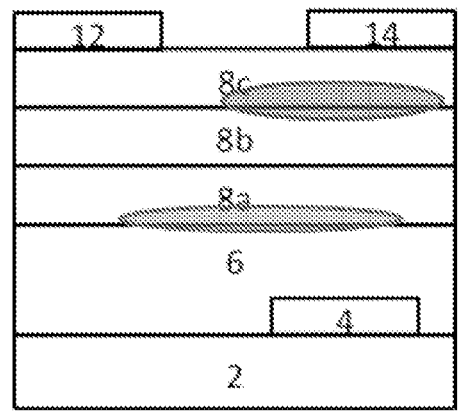
Figure 16:
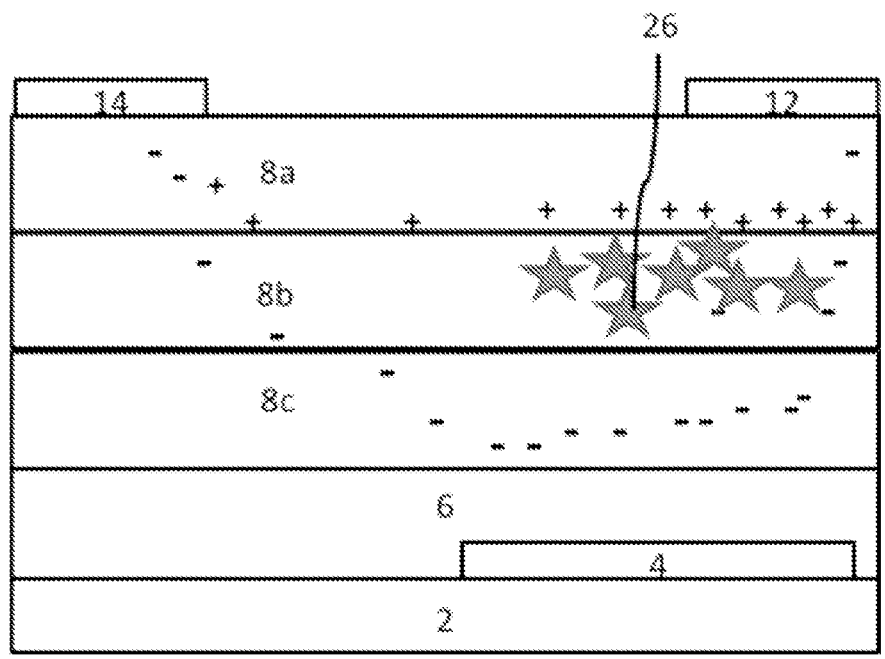
FIG. 16 illustrates how an offset gate electrode can lead to dissimilar charge accumulations for holes and electrons, which can result in a greater probability for charges to recombine.

Referring to FIG. 15a, in a conventional OLET where the gate electrode is aligned with the channel region, uniform charge accumulation for both hole and electrons is expected in the respective charge transport sublayers. Referring to FIG. 15b and FIG. 16, in an OLET according to the present teachings where the gate electrode is offset to overlap with one of the charge injection electrodes, dissimilar charge accumulation is expected for holes and electrons in the respective charge transport sublayers. This gives rise to the possibility to modify the device geometry, including the alignment of the charge injection electrodes with respect to the gate electrode, and the arrangement of the two charge transport sublayers with respect to their respective proximity to the dielectric layer, depending on the lower mobility material in the stack. Typically, the charge transport layer that is farther away from the dielectric layer (in a bottom-gate architecture) has a lower carrier mobility due to poorer morphology. In the embodiment shown in FIG. 16, the hole transport sublayer 8a is the top layer. To compensate for the expected lower carrier mobility, the gate electrode 4 can be offset to overlap with the hole electrode 12. In addition, because of the uneven charge accumulation (higher carrier density near the hole electrode in both of the charge transport layers), it is believed that there is a greater probability for charges to recombine to form more excitons.

Figure 17:
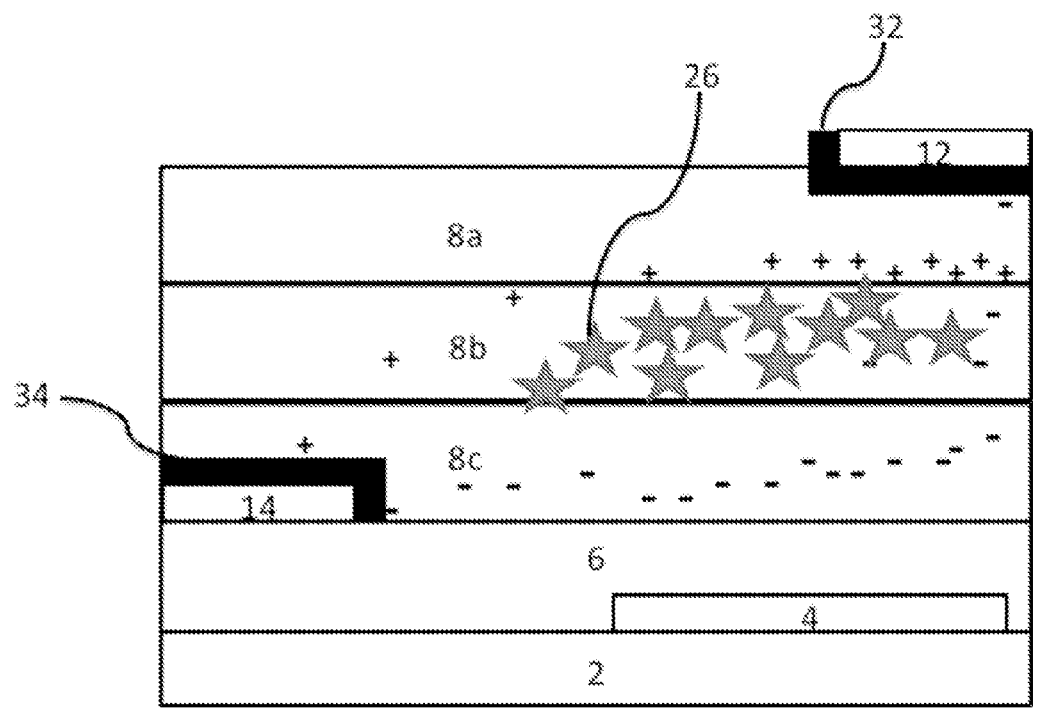
FIG. 17 illustrates an embodiment of the present OLET that includes a hole injection layer 32 and an electron injection layer 34.

The OLETs described herein can further include charge injection layers. Referring to FIG. 17, a hole injection layer 32 can be deposited between the hole transport sublayer 8a and the hole electrode 12, and an electron injection layer 34 can be deposited between the electron electrode 14 and the electron transport sublayer 8c.

Accordingly, in particular embodiments, the present OLET can include a staggered source-drain architecture with an offset gate electrode, in which the hole electrode 12 is positioned in contact with the hole transport sublayer 8a, and the electron electrode 14 is positioned in contact with the electron transport sublayer 8c. An example of such embodiments is illustrated in FIG. 17. In addition, the gate electrode 4 can be positioned to overlap with the electrode that is located on the top most surface which, in the embodiment shown in FIG. 17, is the hole electrode 12. This helps to compensate for the lower charge carrier mobility attributed to the top most semiconductor layer due to the expected poorer film morphology. Furthermore, the electrodes can be coated with a hole injection layer 32 and an electron injection layer 34, respectively, to further reduce contact resistance. In this configuration, it is desirable that the gate electrode (or the overlapping electrode) is a transparent electrode because it is expected that most of the light being generated will be close to the electrodes.

OLETs according to the present teachings can be fabricated using various deposition processes known in the art. For example, in a bottom-gate configuration, an optional planarization or surface-modifying layer can be formed onto a transparent substrate, e.g., by spin-coating. A metallic thin film can be thermally evaporated thereon, followed by etching or other patterning techniques to form the gate electrode. The dielectric layer, depending on its composition, can be deposited by a solution-phase process such as spin-coating or by chemical or physical vapor deposition. This can be followed by the formation of the active channel layer via sequential deposition of the first charge transport sublayer, the emissive sublayer, and the second charge transport sublayer. The hole electrode and the electron electrode can be formed using similar or different techniques as the gate electrode. Additional techniques that can be used to form the channel layer and/or the dielectric layer include sputtering, ion-assisted deposition (IAD), chemical vapor deposition, physical vapor deposition, different types of printing techniques (e.g., flexo printing, litho printing, gravure printing, ink-jetting, pad printing, and so forth), drop casting, dip coating, doctor blading, roll coating, and spin-coating. In preferred embodiments, both the channel layer and the dielectric layer can be formed from a solution-phase process such as spin-coating, slot coating, or printing. Electrical contacts can be formed by processes such as, but not limited to, thermal evaporation and radiofrequency or e-beam sputtering, as well as various deposition processes, including but not limited to those described immediately above (e.g., flexo printing, litho printing, gravure printing, ink-jetting, pad printing, screen printing, drop casting, dip coating, doctor blading, roll coating, and spin-coating).

The present OLETs can be fabricated on various substrates, including plastic, flexible substrates that have a low temperature resistance. Examples of such flexible substrates include polyesters such as polyethylene terephthalate, polyethylene naphthalate, polycarbonate; polyolefins such as polypropylene, polyvinyl chloride, and polystyrene; polyphenylene sulfides such as polyphenylene sulfide; polyamides; aromatic polyamides; polyether ketones; polyimides; acrylic resins; polymethylmethacrylate, and blends and/or copolymers thereof. In some embodiments, the substrate can be a rigid transparent substrate such as glass, quartz and VYCOR®. Substrate-gate materials commonly used in thin-film transistors also can be used. Examples include doped silicon wafer, tin-doped indium oxide (ITO) on glass, tin-doped indium oxide on polyimide or mylar film, aluminum or other metals alone or coated on a polymer such as polyethylene terephthalate, a doped polythiophene, and the like.

The source/drain electrodes (or hole/electron electrodes) as well as the gate electrode can be made using various deposition techniques. For example, the electrodes can be deposited through a mask, or can be deposited then etched or lifted off (photolithography). Suitable deposition techniques include electrodeposition, vaporization, sputtering, electroplating, coating, laser ablation and offset printing, from metal or metal alloy including copper, aluminum, gold, silver, molybdenum, platinum, palladium, and/or nickel, or an electrically conductive polymer such as polyethylenethioxythiophene (PEDOT). Charge carrier injection can be facilitated by the use of a material for the injection electrode (hole electrode or electron electrode) that has a low barrier against injection of a charge carrier type into the hole transport sublayer and the electron transport sublayer, respectively. For example, the electron electrode can comprise one or more elements selected from the group consisting of Au, Ca, Mg, Al, In, and a perovskite manganites ($RE_{1-x}A_xMnO_3$, RE=rare earth element such as La, Nd, Pr etc., A=alkaline metal). The hole electrode can comprise at least one material selected from the group consisting of Au, indium tin oxide, Cr, Cu, Fe, Ag, poly(3,4-ethylenedioxthiophene) combined with poly (styrenesulfonate) (PEDOT:PSS), and a perovskite manganite ($Re_{1-x}A_xMnO_3$). In certain embodiments, the hole electrode and the electron electrode can be made of conductors with different work functions to favor both hole and electron injection.

The dielectric layer can be composed of inorganic (e.g., oxides such as $SiO_2$, $Al_2O_3$, or $HfO_2$; and nitrides such as $Si_3N_4$), organic (e.g., polymers such as polycarbonate, polyester, polyimide, polystyrene, polyhaloethylene, polymethylmethacrylate), or hybrid organic/inorganic materials. The dielectric layer can be coupled to the gate electrode (bottom-gate) or the channel layer (top-gate) by various methods known in the art. In addition to the methods already described, the dielectric layer can be formed via the growth of self-assembled nanodielectric materials (such as those described in Yoon et al., *PNAS*, 102 (13): 4678-4682 (2005), and Ha et al., *Chem. Mater.*, 21(7): 1173-1175 (2009)); solution-processing of inorganic/organic hybrid materials (e.g., as described in Ha et al., *J. Am. Chem. Soc.*, 132 (49): 17428-17434 (2010)); and low-temperature solution-processing of metal oxides (e.g., as described in International Publication Number WO 2012/103528). Furthermore, the dielectric material can be in the form of a bilayer composed of different materials, for example, a combination of inorganic/organic materials, materials with different dielectric constants, or materials that can be processed by different techniques (e.g., solution-processing and vapor deposition).

With respect to the composition of the channel layer, various p-type semiconductors, n-type semiconductors, and organic electroluminescence semiconductors known in the art can be used according to the present teachings, respectively, as the hole transport sublayer, the electron transport sublayer, and the emissive sublayer in the present OLET. For example, the channel layer can comprise small molecule materials, polymers, and/or metal complexes.

Suitable materials for the electron transport (n-type) sublayer can include one class of n-type organic semiconductors (OSCs) that relates to oligomers, homopolymers or copolymers of thiophenes, particularly those substituted with fluorocarbons. For example, α,ω-diperfluorohexylquaterhiophenes and other fluorocarbon-substituted thiophene oligomers are described in U.S. Pat. No. 6,585,914.

Another class of n-type OSCs relates to fused ring tetracarboxylic diimides and their derivatives. For example, cyanated perylene diimides and cyanated naphthalene diimides, more specifically, N,N'-bis-substituted-(1,7 & 1,6)-di-cyano-perylene-3,4:9,10-bis(dicarboximide)s and N,N'-bis-substituted 2,6-dicyanonaphthalene-1,4,5,8-bis(dicarboximide)s such as those described in U.S. Pat. Nos. 7,671,202, 7,902,363, and 7,569,693, and U.S. Patent Application Publication No. 2010/0319778 have been used as n-type semiconductors. Specific examples include N,N'-bis(cyclohexyl)-(1,7 & 1,6)-dicyano-perylene-3,4:9,10-bis(dicarboximide) ($CN_2PDI$); N,N'-bis(1H-perfluorobutyl)-(1,7 & 1,6)-di-cyano-perylene-3,4:9,10-bis(dicarboximide); N,N'-bis(n-octyl)-(1,7 & 1,6)-di-cyano-perylene-3,4:9,10-bis(dicarboximide) (PDI-8CN$_2$); N,N'-bis(n-octyl)-2,6-di-cyanonaphthalene-1,4,5,8-bis(dicarboximide) (NDI-8CN$_2$); N,N'-bis(2-methylhexyl)-(1,7 & 1,6)-dicyanoperylene-3,4:9,10-bis(dicarboximide); N,N'-bis(2-ethylhexyl)-(1,7 & 1,6)-dicyanoperylene-3,4:9,10-bis(dicarboximide); N,N'-bis[(3S)-3,7-dimethyl-6-octenyl]-(1,7 & 1,6)-dicyanoperylene-3,4:9,10-bis(dicarboximide); N,N'-bis(4-n-hexylphenyl)-(1,7 & 1,6)-dicyanoperylene-3,4:9,10-bis(dicarboximide); N,N'-bis(4-n-dodecylphenyl)-(1,7 & 1,6)-dicyanoperylene-3,4:9,10-bis(dicarboximide); N,N'-bis{4-[(3S)-3,7-dimethyl-6-octenyl]phenyl}-(1,7 & 1,6)-dicyanoperylene-3,4:9,10-bis(dicarboximide); N,N'-bis(4-heptyloxyphenyl)-(1,7 & 1,6)-dicyanoperylene-3,4:9,10-bis(dicarboximide); N,N'-bis(4-biphenylyl)-(1,7 & 1,6)-dicyanoperylene-3,4:9,10-bis(dicarboximide); N,N'-bis[4-(4'-n-octylbiphenylyl)]-(1,7 & 1,6)-dicyanoperylene-3,4:9,10-bis(dicarboximide); N,N'-bis{4-[4'-((3S)-3,7-dimethyl-6-octenyl]biphenylyl}-(1,7 & 1,6)-dicyanoperylene-3,4:9,10-bis(dicarboximide); N,N'-bis[4-(2',3',4',5',6'-pentafluorobiphenyl)]-(1,7 & 1,6)-dibromoperylene-3,4:9,10-bis(dicarboximide); N,N'-bis[4-(4'-n-octyl-2',3',5',6'-tetrafluorobiphenyl)]-(1,7 & 1,6)-dicyanoperylene-3,4:9,10-bis(dicarboximide); N,N'-bis[4-(4'-n-octyl-2,3,5,6-tetrafluorobiphenyl)]-(1,7 & 1,6)-dicyanoperylene-3,4:9,10-bis(dicarboximide); N,N'-bis(benzyl)-(1,7 & 1,6)-dicyanoperylene-3,4:9,10-bis(dicarboximide); N,N'-bis(4-n-butylbenzyl)-(1,7 & 1,6)-dicyanoperylene-3,4:9,10-bis(dicarboximide); N,N'-bis(4-sec-butylphenyl)-(1,7 & 1,6)-dicyanoperylene-3,4:9,10-bis(dicarboximide); N,N'-bis{4-[(3S)-3,7-dimethyl-6-octenyloxy]benzyl}-(1,7 & 1,6)-dicyanoperylene-3,4:9,10-bis(dicarboximide); N,N'-bis(4-benzylphenyl)-(1,7 & 1,6)-dicyanoperylene-3,4:9,10-bis(dicarboximide); N,N'-bis{4-[1-(2-phenylethyl)]phenyl}-(1,7 & 1,6)-dicyanoperylene-3,4:9,10-bis(dicarboximide); N,N'-bis(4-n-benzoylphenyl)-(1,7 & 1,6)-dicyanoperylene-3,4:9,10-bis(dicarboximide); N,N'-bis(1-methylbutyl)-(1,7 & 1,6)-dicyanoperylene-3,4:9,10-bis(dicarboximide); N,N'-bis(1-methylpentyl)-(1,7 & 1,6)-dicyanoperylene-3,4:9,10-bis(dicarboximide); N,N'-bis(1-methylhexyl)-(1,7 & 1,6)-dicyanoperylene-3,4:9,10-bis(dicarboximide); N,N'-bis(1-ethylpropyl)-(1,7 & 1,6)-dicyanoperylene-3,4:9,10-bis(dicarboximide); N,N'-bis(1-ethylbutyl)-(1,7 & 1,6)-dicyanoperylene-3,4:9,10-bis(dicarboximide); N,N'-bis(1-ethylpentyl)-(1,7 & 1,6)-dicyanoperylene-3,4:9,10-bis(dicarboximide); N,N'-bis(1-ethylhexyl)-(1,7 & 1,6)-dicyanoperylene-3,4:9,10-bis(dicarboximide); and N,N'-bis(1,3-dimethylbutyl)-(1,7 & 1,6)-dicyanoperylene-3,4:9,10-bis(dicarboximide).

More recently, hybrid perylene/naphthalene diimides, pi-bridge linked dimeric naphthalene diimides, and large disc-like ovalene diimides (with optional cyano substituents) have been reported as n-type semiconductors. See Yue et al., "Hybrid Rylene Arrays via Combination of Stille Coupling and C—H Transformation as High-Performance Electron Transport Materials," *J. Am. Chem. Soc.* (2012); Hwang et al., "Stable Solution-Processed Molecular n-Channel Organic Field-Effect Transistors," *Adv. Mater*. (2012) and Polander et al., "Solution-Processed Molecular Bis (Naphthalene Diimide) Derivatives with High Electron Mobility," *Chem. Mater.*, 23: 3408-3410 (2011); Li et al., "Disc-like 7,14-dicyano-ovalene-3,4:10,11-bis(dicarboximide) as a solution-processible n-type semiconductor for air stable field-effect transistors," *Chem. Sci.*, 3: 846-850 (2012). Naphthalene diimides fused with 2-(1,3-dithiol-2-ylidene)malonitrile groups also have been reported as n-type semiconductors. See Gao et al., "Core-Expanded Naphthalene Diimides Fused with 2-(1,3-Ditiol-2-Ylidene)Malonitrile Groups for High-Performance Ambient-Stable, Solution-Processed n-Channel Organic Thin Film Transistors," *J. Am. Chem. Soc.*, 132(11): 3697-3699 (2010).

Another class of n-type semiconductors relates to dicyanomethylene-substituted conjugated systems. For example, U.S. Pat. No. 7,928,249 describes dicyanomethylene-substituted fused ring compounds such as 2,8-di-(3-dodecylthien-2-yl)-indeno[1,2-b]fluorene-6,12-dimalonitrile; 2,8-dithien-2-yl-tetraphenylenedimalonitrile; and 2,8-di-(4'-dodecylthien-2'-yl]-4-dodecylthien-2-yl)-indeno[1,2-b]fluorene-6,12-dimalono-nitrile. Dicyanomethylene-substituted diketopyrrolopyrrole-containing quinoidal small molecules also have been investigated as n-type semiconductors. See Qiao et al., "Diketopyrrolopyrrole-Containing Quinoidal Small Molecules for High-Performance, Air-Stable, and Solution-Processable n-Channel Organic Field-Effect Transistors," *J. Am. Chem. Soc.*, 134: 4084-4087 (2012).

Thionated aromatic bisimides also can be used as n-type semiconductors. Examples include those described in International Publication Nos. WO2011/082234 such as (S,S)-PDIS$_1$1MP, (S,S)-cis-PDIS$_2$1MP, (S,S)-trans-PDIS$_2$1MP, (S,S)-PDIS$_3$1MP, (S,S)-PDIS$_4$1MP, (S,S)-trans-PDIS$_2$1 Mhex, (R,R)-trans-PDIS$_2$1 Mhex, (S,R)-trans-PDIS$_2$1 Mhex, (R,S)-trans-PDIS$_2$1 Mhex, (R,R)-trans-PDIS$_2$1 Mhept, (S,S)-trans-PDIS$_2$1MO, trans-PDIS$_2$1Epr, cis-PDIS$_2$1Epr, trans-PDIS$_2$1M3MB, trans-PDIS$_2$2OD, trans-PDIS$_2$1MP-CN$_2$, cis-NDIS$_2$Cy, trans-NDIS$_2$Cy, NDIS$_1$2EH, trans-NDIS$_1$2EH, cis-NDIS$_1$2EH, NDIS$_3$2EH, SPDI-F, trans-PDIS$_2$1MP-F$_2$, and S—C2OD-C6$_2$.

N-type semiconducting polymers also can be used according to the present teachings. Examples of n-type semiconducting polymers include oligomers, homopolymers and copolymers of naphthalenediimides described in U.S. Patent Application Publication No. US 2010/0326527 such as poly {N,N'-bis(2-ethylhexyl)-1,4,5,8-naphthalene diimide-2,6-diyl]-alt-5,5'-(2,2'-bithiophene)}; poly {N,N'-bis(2-ethylhexyl)-1,4,5,8-naphthalene diimide-2,6-diyl]-alt-5,5'-(2,5-thiophene)}; poly {N,N'-bis(2-octyldodecyl)-1,4,5,8-naphthalene diimide-2,6-diyl]-alt-5,5'-(2,2'-bithiophene)}; poly {N,N'-bis(1-methylhexyl)-1,4,5,8-naphthalene diimide-2,6-diyl]-alt-5,5'-(2,2'-bithiophene)}; poly {N,N'-bis(2-octyldodecyl)-1,4,5,8-naphthalene diimide-2,6-diyl]-alt-5,5'''-(quarterthiophene)}; poly {N,N'-bis(2-octyldodecyl)-1,4,5,8-naphthalene diimide-2,6-diyl]-alt-5,5'-(2,2'-bithiazole)}; poly {N,N'-bis(2-octyldodecyl)-1,4,5,8-naphthalene diimide-2,6-diyl]-alt-5,5'-(4',7'-di-2-thienyl-2',1',3',-benzothiadiazole)}; poly {N,N'-bis(2-octyldodecyl)-1,4,5,8-naphthalene diimide-2,6-diyl]-alt-5,5'-(1',4'-di-2-thienyl-2',3',5',6'-tetrafluorobenzene)}; poly {N,N'-bis(2-octyldodecyl)-1,4,5,8-naphthalene diimide-2,6-diyl]-alt-5,5'-(1,2-bis(2'-thienyl)vinyl)}; poly {N,N'-bis(2-octyldodecyl)-1,4,5,8-naphthalene diimide-2,6-diyl]-alt-5,5'-(2,6-bis(2'-thienyl)naphthalene)}; and poly {N,N'-bis(2-octyldodecyl)-1,4,5,8-naphthalene diimide-2,6-diyl]-alt-5,5'-(1,1'-dimethyl-2,2'-bipyrrole)}.

Other linear acenes, bent acenes, arylvinylenes, phenylenes, and fused (hetero)arenes including those substituted with alkylcarbonyl, arylcarbonyl, cyano and/or alkyl groups also can be suitable n-type semiconductor materials for use according to the present teachings.

In certain embodiments, inorganic n-type OSCs can be used. For example, solution-processable metal oxides (e.g., ITO, indium oxide, indium zinc oxide, indium gallium zinc oxide) and chalcogenides (e.g., CdSe) are described in U.S. Pat. No. 8,017,458 and International Publication No. WO 2012/103528.

Suitable materials for the hole transport (p-type) sublayer can include one class of p-type organic semiconductors (OSCs) that relates to oligothiophenes and polythiophenes. For example, a dihexylquaterhiophene and other alkyl-substituted thiophene oligomers are described in Garnier et al., "Dihexylquaterthiophene, A Two-Dimensional Liquid Crystal-Like Organic Semiconductor with High Transport Properties," *Chem. Mater.*, 10 (11): 3334-3339 (1998). Polythiophenes such as regioregular poly(3-hexylthiophene) (rr-P3HT) also can be used.

Another class of p-type OSCs relates to soluble pentacene compounds such as those described in U.S. Pat. No. 7,125,989. Soluble pentacene compounds, as exemplified by pentacene-N-sulfinyl-tert-butylcarbamate, can be obtained from Diels-Alder reaction of pentacene with hetero dienophiles. Another pentacene derivative, 6,13-bis(triisopropyl-silyl-ethynyl)pentacene (TIPS pentacene), also has been shown to have reasonable solubility in common organic solvents.

Further classes of p-type semiconductors include thienocoronene-based compounds described in International Publication No. WO2012/030662. Specific examples include 1PB-thienocoronene, 2BO-thienocoronene, 1MP-thienocoronene, (S)-2 MB-thienocoronene, undecanoxy-thienocoronene, and dodecyl-thienocoronene.

More recently, alkylated [1]benzothieno[3,2-b]benzothiophenes and alkylated dinaphtho[2,3-b:2',3'-f]thieno[3,2-b]thiophenes have been reported as highly soluble p-type OSCs. See Ebata, H. et al., "Highly Soluble [1]Benzothieno [3,2-b]benzothiophenes (BTBT) Derivatives for High-Performance, Solution-Processed Organic Field-Effect Transistors," *JACS*, 129(51): 15732-15733 (2007); Ebata, H. et al., "Alkylated Dinaphtho[2,3-b:2',3'-f]Thieno[3,2-b] Thiophenes (C$_n$-DNTTs): Organic Semiconductors for High-Performance Thin-Film Transistors," *Adv. Mat.*, 23(10): 1222-1225 (2011); and co-pending, co-assigned U.S. provisional patent application Ser. No. 61/533,785. Other thienoacene compounds such as dihexyl-substituted dibenzo [d,d']thieno[3,2-b;4,5-b']dithiophene also have been developed as p-type semiconductors. See Miyata et al., "High-performance organic field-effect transistors based on dihexyl-substituted dibenzo[d,d']thieno[3,2-b;4,5-b']dithiophene," *J. Mater. Chem.* (2012). Another class of small molecule p-type OSCs relates to naphtha[2,1-b:6,5-b']difuran: A Versatile Motif Available for Solution-Processed Single-Crystal Organic Field-Effect Transistors with High Hole Mobility," *J. Am. Chem. Soc*, 134: 5448-5451 (2012). Yet another class of small molecule p-type OSCs relates to fluorinated anthradithiophene derivatives. See Subramanian et al., "Chromophore Fluorination Enhances Crystallization and Stability of Soluble Anthradithiophene Semiconductors," *J. Am. Chem. Soc.*, 130(9): 2706-2707 (2008).

Recently, 2-(4-hexylphenylvinyl)anthracene has been reported as a p-type semiconductor with strong solid-state blue emission. See Dadvand et al., "Maximizing Field-Effect Mobility and Solid-State Luminescence in Organic Semiconductors," *Angew. Chem. Int. Ed.*, 51: 3837-3841 (2012);

Further exemplary classes of p-type semiconductors include phthalimide-based polymers, certain diketopyrrolopyrrole-based polymers, isoindigo-based conjugated polymers, See International Publication No. WO2010/117449; Li et al., "A High Mobility P-Type DPP-Thieno[3,2-b]thiophene Copolymer for Organic Thin-Film Transistors," *Adv. Mater.*, 22: 4862-4866 (2010), Li et al., "Annealing-Free High-Mobility Diketopyrrolopyrrole-Quaterthiophene Copolymer for Solution-Processed Organic Thin Film Transistors," *J. Am. Chem. Soc.*, 133: 2198-2204 (2011), Bronstein et al., "Thieno[3,2-b]thiophene-Diketopyrrolopyrrole-Containing Polymers for High-Performance Organic Field-Effect Transistors and Organic Photovoltaic Devices," *J. Am. Chem. Soc.*, 133: 3272-3275 (2011) and Chen et al., "Highly pi-Extended Copolymers with Diketopyrrolopyrrole Moieties for High-Performance Field-Effect Transistors," *Adv. Mater.* (2012); Mei et al., "Siloxane-Terminated Solubilizing Side Chains: Bringing Conjugated Polymer Backbones Closer and Boosting Hole Mobilities in Thin-Film Transistors," *J. Am. Chem. Soc.*, 133: 20130-20133 (2011) and Lei et al., "High-Performance Air-Stable Organic Field-Effect Transistors: Isoindigo-Based Conjugated Polymers," *J. Am. Chem. Soc.*, 133: 6099-6101 (2011).

Other linear acenes, bent acenes, arylvinylenes, phenylenes, and fused (hetero)arenes including those substituted with alkyl and/or alkoxy groups also can be suitable p-type semiconductor materials for use according to the present teachings.

Depending on the light emission type (red, green or blue), the energy of the hole-transporting semiconductor material must match that of the electron transporting semiconductor material. Thus, for red emission, the energy difference between the highest occupied molecular orbital (HOMO) of the hole-transporting semiconductor material and the lowest unoccupied molecular orbital (LUMO) of the electron-transporting semiconductor material should be, at a minimum, between about 1.6 eV and about 1.8 eV. For green emission, the energy difference between the HOMO of the hole-transporting semiconductor material and the LUMO of the electron-transporting semiconductor material has to be, at a minimum, between about 2.2 eV and about 2.5 eV. For blue emission, the energy difference between the HOMO of the hole-transporting semiconductor material and the LUMO of the electron-transporting semiconductor material has to be, at a minimum, between about 2.8 eV and about 3.2 eV.

In some embodiments, the emissive sublayer can be a blend that includes a host material and a guest emitter selected from a fluorescent emitter and a phosphorescent emitter. In other embodiments, the emissive sublayer can be prepared from a single-component host-emitting material. Suitable organic electroluminescent light-emitting materials include those having been used in OLED applications. In one embodiment, the emissive sublayer can be composed of a blend of host tris(8-hydroxyquinolinato)aluminium ($Alq_3$) and guest 4-(dicyanomethylene)-2-methyl-6-(p-dimethylaminostyryl)-4H-pyran (DCM).

Further examples of host materials, guest emitters, and single-component host-emitting materials are described in Chaskar et al., "Bipolar Host Materials: A Chemical Approach for Highly Efficient Electrophosphorescent Devices," *Adv. Mater.*, 23(34): 3876-3895 (2011); Tao et al., "Organic host materials for phosphorescent organic light-emitting diodes," *Chem. Soc. Rev.*, 40(5): 2943-2970 (2011); Sasabe et al., "Multifunctional Materials in High-Performance OLEDs: Challenges for Solid-State Lighting," *Chem. Mater.*, 23(3): 621-630 (2011); Tsuboi, "Recent advances in white organic light emitting diodes with a single emissive dopant," *J. Non-Cryst. Solids*, 356(37-40): 1919-1927 (201); Singh et al., "Bio-organic optoelectronic devices using DNA," *Adv. Polym. Sci.*, 223 (Organic Electronics): 189-212 (2010); Kappaun et al., "Phosphorescent organic light-emitting devices: working principle and iridium based emitter materials," *Int. J. Mol. Sci.*, 9(8): 1527-1547 (2008); Tokito et al., "Phosphorescent organic light-emitting devices: triplet energy management," *Electrochemistry*, 76(1): 24-31 (2008); Chen, "Evolution of Red Organic Light-Emitting Diodes: Materials and Devices," *Chem. Mater.*, 16(23): 4389-4400 (2004); Liu et al., "Polyfluorenes with on-chain metal centers," *Adv. Poly. Sci.*, 212 (Polyfluorenes): 125-144 (2008); Danev et al., "Vacuum deposited polyimide—a perfect matrix for nanocomposite materials," *J. Optoelectron. Adv. Mater.*, 7(3): 1179-1190 (2005); U.S. Pat. No. 5,747,183; U.S. Pat. No. 5,683,823; U.S. Pat. No. 6,626,722; U.S. Pat. No. 7,074,502; U.S. Pat. No. 7,671,241; and U.S. Pat. No. 7,772,762.

Some exemplary host materials include polymers such as poly(p-phenylene vinylene), poly(alkyphenylphenylvinylene), poly(alkyphenylphenylvinylene-co-alkoxyphenylenevinylene), polyfluorene, poly(n-vinylcarbazole), and copolymers thereof. Various carbazole compounds, triphenylamine compounds, including hybrids with oxadiazole or benzimidazole also have been used as host materials. Some exemplary guest emitters (light-emitting dyes or dopants) include fluorescent dyes such as various perylene derivatives, anthracene derivatives, rubrene derivatives, carbazole derivatives, fluorene derivatives, and quinacridone derivatives, and phosphorescent emitters such as various transition metal complexes including Ir, Os, or Pt. Some exemplary host-emitting materials include phosphorescent host-emitting compounds based on carbazole derivatives, fluorene derivatives, or 9-naphthylanthracene derivatives, and fluorescent host-emitting compounds based on organometallic chelates such as tris(8-quinolinol) aluminum complexes.

The hole and electron injection layers can be prepared by self-assembly of thiolates, phosphonates, or aliphatic or aromatic carboxylates; by thermal evaporation of various charge transfer complexes and other heteroaromatic or organometallic complexes; or by thermal evaporation or sputtering of various metal oxides, fluorides, or carbonates. The hole injection layer and the electron injection layer can be made of materials that provide a staircase of electronic levels between the energy level of the hole electrode and the electron electrode, and the energy level required for injection into the hole transport sublayer and the electron transport sublayer, respectively. See e.g., Li et al., "Low operating-voltage and high power-efficiency OLED employing $MoO_3$-doped CuPc as hole injection layer," *Displays*, 33(1): 17-20 (2012); Wen et al., "Self-assembled of conducting polymeric nanoparticles and its application for OLED hole injection layer," *Energy Procedia*, 12: 609-614 (2011); Zhang et al., "Role of $Fe_3O_4$ as a p-dopant in improving the hole injection and transport of organic light-emitting devices," *IEEE Journal of Quantum Electronics*, 47(5): 591-596 (2011); Choo et al., "Luminance and charge transport mechanisms for phosphorescent organic light-emitting devices fabricated utilizing a tris(2-phenylpyridine)iridium-doped N,N'-dicarbazolyl-3,5-benzene emitting layer," *Thin Solid Films*, 519(15): 5253-5256 (2011); Tao et al., "Odd-even modulation of electrode work function with self-assembled layer: Interplay of energy barrier and tunneling distance on charge injection in organic light-emitting diodes," *Organic Electronics*, 12(4): 602-608 (2011); Sung et al., "AC Field-Induced Polymer Electroluminescence with Single Wall Carbon Nanotubes," *Nano Letters*, 11(3): 966-972 (2011); Qiao et al., "Controlling charge balance and exciton recombination by bipolar host in single-layer organic light-emitting diodes," *Journal of Applied Physics*, 108(3): 034508/1-034508/8 (2011); Khizar-ul-Haq et al., "Blue organic light-emitting diodes with low driving voltage and enhanced power efficiency based on $MoO_3$ as hole injection layer and optimized charge balance," *Journal of Non-Crystalline Solids*, 356(20-22): 1012-1015 (2010); Qi et al., "Analysis of metal-oxide-based charge generation layers used in stacked organic light-emitting diodes," *Journal of Applied Physics*, 107(1): 014514/1-014514/8 (201); Huang et al., "Materials and interface engineering in organic light-emitting diodes," *Organic Electronics*, 243-261 (2010); Helander et al., "Comparison of $Alq_3$/alkali-metal fluoride/Al cathodes for organic electroluminescent devices," *Journal of Applied Physics*, 104(9): 094510/1-094510/6 (2008); Roy Choudhury et al., "LiF as an n-dopant in tris(8-hydroxyquinoline) aluminum thin films," *Advanced Materials*, 20(8): 1456-1461 (2008); Vacca et al., "Poly(3,4-ethylenedioxythiophene):poly(4-styrenesulfonate) ratio: Structural, physical and hole injection properties in organic light emitting diodes," *Thin Solid Films*, 516(12): 4232-4237 (2008); Yang et al., "Improved fabrication process for enhancing light emission in single-layer organic light-emitting devices doped with organic salt," Japanese Journal of Applied Physics, 47(2, Pt. 1): 1101-1103 (2008); Kim et al., "UV-ozone surface treatment of indium-tin-oxide in organic light emitting diodes," Journal of the Korean Physical Society, 50(6): 1858-1861 (2007); Prat et al., "Stable, highly efficient and temperature resistant organic light-emitting devices," *Japanese Journal of Applied Physics, Part 1: Regular Papers, Brief Communications & Review Papers*," 46(4A): 1727-1730 (2007); Luo et al., "Improving the stability of organic light-emitting devices by using a hole-injection-tunable-anode-buffer-layer," *Journal of Applied Physics*, 101(5): 054512/1-054512/4 (2007); Matsushima et al., "Charge-carrier injection characteristics at organic/organic heterojunction interfaces in organic light-emitting diodes," *Chemical Physics Letters*, 435(4-6): 327-330 (2007); Kim et al., "Controllable work function of Li-Al alloy nanolayers for organic light-emitting devices," *Advanced Engineering Materials*, 7(11): 1023-1027 (2005); Kato, "Designing Interfaces That Function to Facilitate Charge Injection in Organic Light-Emitting Diodes," *Journal of the American Chemical Society*, 127(33): 11538-11539 (2005); Veinot et al., "Toward the Ideal Organic Light-Emitting Diode. The Versatility and Utility of Interfacial Tailoring by Cross-Linked Siloxane Interlayers," *Accounts of Chemical Research*, 38(8): 632-643 (2005); Oyamada et al., "Extremely low-voltage driving of organic light-emitting diodes with a Cs-doped phenyldipyrenylphosphine oxide layer as an electron-injection layer," *Applied Physics Letters*, 86(3): 033503/1-033503/3 (2005); Hughes et al., "Electron-transporting materials for organic electroluminescent and electrophosphorescent devices," *Journal of Materials Chemistry*, 15(1): 94-107 (2005); D'Andrade et al., "Efficient organic electrophosphorescent white-light-emitting device with a triple doped emissive layer," *Advanced Materials*, 16(7): 624-628 (2004); Kanno et al., "Development of OLED with high stability and luminance efficiency by co-doping methods for full color displays," *IEEE Journal of Selected Topics in Quantum Electronics*, 10(1): 30-36 (2004); Han et al., "Transparent-cathode for top-emission organic light-emitting diodes," *Applied Physics Letters*, 82(16): 2715-2717 (2003); Tutis et al., "Internal electric field and charge distribution in multilayer organic light-emitting diodes," *Journal of Applied Physics*, 93(8): 4594-4602 (2003); Mathai et al., "Controlled injection of holes into AlQ3 based OLEDs by means of an oxidized transport layer," *Materials Research Society Symposium Proceedings*, 708(Organic Optoelectronic Materials, Processing and Devices): 101-106 (2002); Crone et al., "Charge injection and transport in single-layer organic light-emitting diodes," *Applied Physics Letters*, 73(21): 3162-3164 (1998); and Park et al., "Charge injection and photooxidation of single conjugated polymer molecules," *Journal of the American Chemical Society*, 126(13): 4116-7 (2004).

The OLETs according to the invention can be operated by applying a first appropriate bias voltage to the gate electrode, and injecting electrons from the electron electrode and holes from the hole electrode, while maintaining a second bias voltage between the latter two electrodes. The first and second bias voltages can be continuous voltages. Alternatively, the first and second bias voltages also can be pulsed voltages.

All publications, including but not limited to patents and patent applications, cited in this specification are herein incorporated by reference as if each individual publication were specifically and individually indicated to be incorporated by reference herein as though fully set forth.

The present teachings encompass embodiments in other specific forms without departing from the spirit or essential characteristics thereof. The foregoing embodiments are therefore to be considered in all respects illustrative rather than limiting on the present teachings described herein. Scope of the present invention is thus indicated by the appended claims rather than by the foregoing description, and all changes that come within the meaning and range of equivalency of the claims are intended to be embraced therein.

The invention claimed is:

1. A light-emitting transistor comprising a stacked structure, the stacked structure comprising:
    a substrate;
    a gate electrode;
    a channel layer comprising one or more organic sublayers, the one or more organic sublayers comprising:
        a first sublayer comprising an electron-transporting semiconductor material,
        a second sublayer comprising a hole-transporting semiconductor material, and
        a third sublayer comprising an electroluminescent semiconductor material;
    a dielectric layer positioned between the gate electrode and the channel layer; and
    a hole electrode and an electron electrode being spaced apart from each other at a planar distance defining the length (L) of a channel region therebetween, each of the hole electrode and the electron electrode being positioned either within the channel layer or on top of a first side of the channel layer,
    wherein the hole electrode is positioned away from a second side of the channel layer at a distance d1 and the electron electrode is positioned away from the second side of the channel layer at a distance d2 that is different from d1.

2. The device of claim 1, wherein the third sublayer is disposed between the first sublayer and the second sublayer.

3. The device of claim 1, wherein the electron electrode is positioned in contact with the first sublayer and the hole electrode is positioned in contact with the second sublayer.

4. The device of claim 1 further comprising an electron-injection layer, wherein the electron electrode is coupled to the first sublayer via the electron-injection layer.

5. The device of claim 1 further comprising a hole-injection layer, wherein the hole electrode is coupled to the second sublayer via the hole-injection layer.

6. The device of claim 1 comprising a bottom-gate structure, wherein the gate electrode is coupled to the substrate.

7. The device of claim 1 comprising a top-gate structure, wherein the channel layer is coupled to the substrate.

8. The device of claim 1, wherein the gate electrode comprises a length ($L_G$) that is identical to L, and wherein the edges of the gate electrode are aligned with an edge of the hole electrode and an edge of the electron electrode.

9. The device of claim 1, wherein the gate electrode comprises a length ($L_G$) that is greater than L and overlaps with at least one of the hole electrode and the electron electrode.

10. The device of claim 1, wherein the gate electrode is offset from the channel region and overlaps with either the hole electrode or the electron electrode but not both.

11. The device of claim 1, wherein the third sublayer comprises a single-component host-emitting material or a blend comprising a host material and a guest emitter.

12. The device of claim 1, wherein the energy difference between the highest occupied molecular orbital (HOMO) of the hole-transporting semiconductor material and the lowest unoccupied molecular orbital (LUMO) of the electron-transporting semiconductor material is between about 1.6 eV and about 1.8 eV.

13. The device of claim 1, wherein the energy difference between the highest occupied molecular orbital (HOMO) of the hole-transporting semiconductor material and the lowest unoccupied molecular orbital (LUMO) of the electron-transporting semiconductor material is between about 2.2 eV and about 2.5 eV.

14. The device of claim 1, wherein the energy difference between the highest occupied molecular orbital (HOMO) of the hole-transporting semiconductor material and the lowest unoccupied molecular orbital (LUMO) of the electron-transporting semiconductor material is between about 2.8 eV and about 3.2 eV.

15. The device of claim 10 having a bottom-gate structure, further comprising an electron-injection layer deposited between the electron-transporting semiconductor material and the electron electrode, and a hole-injection layer deposited between the hole-transporting semiconductor material and the hole electrode, wherein the electron-transporting semiconductor material is coupled to the dielectric layer, and the gate electrode overlaps with the hole electrode.

16. The device of claim 10 having a bottom-gate structure, further comprising an electron-injection layer deposited between the electron-transporting semiconductor material and the electron electrode, and a hole-injection layer deposited between the hole-transporting semiconductor material and the hole electrode, wherein the hole-transporting semiconductor material is coupled to the dielectric layer, and the gate electrode overlaps with the electron electrode.

* * * * *